United States Patent
Harada et al.

(10) Patent No.: US 9,998,119 B2
(45) Date of Patent: Jun. 12, 2018

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Shintaro Harada, Kanagawa (JP); Munehiro Kozuma, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/593,430

(22) Filed: May 12, 2017

(65) Prior Publication Data

US 2017/0338818 A1    Nov. 23, 2017

(30) Foreign Application Priority Data

May 20, 2016  (JP) .................................. 2016-101128
Oct. 25, 2016  (JP) .................................. 2016-208279

(51) Int. Cl.
*H01L 29/78*  (2006.01)
*H01L 27/12*  (2006.01)
(Continued)

(52) U.S. Cl.
CPC ......... *H03K 19/0013* (2013.01); *G11C 19/28* (2013.01); *H01L 27/124* (2013.01);
(Continued)

(58) Field of Classification Search
CPC ............ H03K 19/0013; H03K 19/1778; H01L 29/78; H01L 29/785; H01L 29/7851;
(Continued)

(56) References Cited

U.S. PATENT DOCUMENTS 6,127,702 A    10/2000  Yamazaki et al.
7,550,994 B1    6/2009  Camarota et al.
(Continued)

FOREIGN PATENT DOCUMENTS

JP    2015-027080    2/2015

OTHER PUBLICATIONS

Hasitha Muthumala Waidyasooriya et al.; "Implementation of a Partially Reconfigurable Multi-Context FPGA Based on Asynchronous", IEICE Trans. Electron. (IEICE Transactions on Electronics), vol. E92-C, No. 4, pp. 539-549; Apr. 2009.
(Continued)

*Primary Examiner* — Monica D Harrison
(74) *Attorney, Agent, or Firm* — Fish & Richardson P.C.

(57) ABSTRACT

Provided is a semiconductor device in which leakage current due to miniaturization of a semiconductor element is reduced and delay at a time of context switch of a multi-context PLD is reduced. A first transistor and a second transistor included in a charge retention circuit functioning as a configuration memory each include an oxide semiconductor in a semiconductor layer serving as a channel formation region. One of a source and a drain of the first transistor is electrically connected to a gate of the second transistor. One of a source and a drain of the second transistor is connected to a switch for context switch. In the switch used for context switch, electrostatic capacitance on an input side to which the one of the source and the drain of the second transistor is connected is larger than electrostatic capacitance on an output side.

26 Claims, 26 Drawing Sheets

(51) Int. Cl.
*H03K 19/00* (2006.01)
*H01L 29/786* (2006.01)
*G11C 19/28* (2006.01)
*H03K 19/177* (2006.01)

(52) U.S. Cl.
CPC ...... *H01L 27/1207* (2013.01); *H01L 27/1225* (2013.01); *H01L 27/1255* (2013.01); *H01L 29/7851* (2013.01); *H01L 29/7869* (2013.01); *H03K 19/1778* (2013.01)

(58) Field of Classification Search
CPC ... H01L 29/786; H01L 29/7869; H01L 27/12; H01L 27/124; H01L 27/125; H01L 27/1255
USPC .......................................................... 257/43
See application file for complete search history.

(56) References Cited

U.S. PATENT DOCUMENTS

| | | |
|---|---|---|
| 7,674,650 B2 | 3/2010 | Akimoto et al. |
| 7,944,765 B1 | 5/2011 | Han et al. |
| 8,675,382 B2 | 3/2014 | Kurokawa |
| 8,850,108 B1 | 9/2014 | Hayes et al. |
| 9,065,438 B2 | 6/2015 | Aoki et al. |
| 2010/0148171 A1 | 6/2010 | Hayashi et al. |
| 2013/0207170 A1 | 8/2013 | Kurokawa |
| 2013/0285697 A1 | 10/2013 | Kurokawa |
| 2013/0286757 A1 | 10/2013 | Takemura |
| 2013/0314124 A1 | 11/2013 | Ikeda et al. |
| 2013/0321025 A1 | 12/2013 | Kurokawa et al. |
| 2014/0126271 A1 | 5/2014 | Aoki et al. |
| 2014/0269013 A1 | 9/2014 | Tsutsui et al. |
| 2014/0286076 A1 | 9/2014 | Aoki et al. |
| 2014/0368235 A1 | 12/2014 | Aoki et al. |
| 2015/0048362 A1* | 2/2015 | Endo ................. H01L 27/1225 257/43 |

OTHER PUBLICATIONS

D. Suzuki et al.; "Fabrication of a 3000-6-Input-LUTs Embedded and Block-Level Power-Gated Nonvolatile FPGA Chip Using p-MTJ-Based Logic-in-Memory Structure," Dig. Symp. VLSI Circuits, pp. 172-173; Jun. 15, 2015.

Shoichi Masui et al.; "A Ferroelectric Memory-Based Secure Dynamically Programmable Gate Array," J. Solid-State Circuit, vol. 38, No. 5, pp. 715-725; May 2003.

Takeshi Aoki et al.; "Normally-Off Computing with Crystalline InGaZnO-based FPGA," IEEE ISSCC Dig. Tech. Papers, pp. 502-504; Feb. 12, 2014.

Tomoyuki Ishii et al.; "A Poly-Silicon TFT With a Sub-5-nm Thick Channel for Low-Power Gain Cell Memory in Mobile Applications", IEEE Transactions on Electron Devices, vol. 51, No. 11, pp. 1805-1810, Nov. 2004.

Wonchan Kim et al.; "An Experimental High-Density DRAM Cell with a Built-in Gain Stage", IEEE Journal of Solid-State Circuits, vol. 29, No. 8, pp. 978-981, dated in Aug. 1994.

Shoji Shukuri et al.; "A Complementary Gain Cell Technology for sub-1 V Supply DRAMs", IEDM 92: Technical Digest of International Electron Devices Meeting, pp. 1006-1008, Dec. 13, 1992.

Shoji Shukuri et al.; "A Semi-Static Complementary Gain Cell Technology for Sub-1 V Supply DRAM's", IEEE Transactions on Electron Devices, vol. 41, No. 6, pp. 926-931, Jun. 1994.

Ki Chul Chun et al.; "A 3T Gain Cell Embedded DRAM Utilizing Preferential Boosting for High Density and Low Power On-Die Caches", IEEE Journal of Solid-State Circuits, vol. 46, No. 6, pp. 1495-1505; Jun. 2011.

Fatemeh Eslami et al.; "Capacitive Boosting for FPGA Interconnection Networks", 21st International Conference on Field Programmable Logic and Applications, vol. 21, pp. 453-458; 2011.

Steve Trimberger et al.; "A Time-Multiplexed FPGA", FCCM 1997 (IEEE 5th Annual International Symposium on Field-Programmable Custom Computing Machines), pp. 22-28, Apr. 16, 1997.

Daisuke Suzuki et al.; "Design of a Process-Variation-Aware Nonvolatile MTJ-Based Lookup-Table Circuit", SSDM 2010 (Extended Abstracts of the 2010 International Conference on Solid State Devices and Materials), pp. 1146-1147, Sep. 22, 2010.

Daisuke Suzuki et al.; "Fabrication of a Nonvolatile Lookup-Table Circuit Chip Using Magneto/Semiconductor-Hybrid Structure for an Immediate-Power-Up Field Programmable Gate Array", 2009 Symposium on VLSI Circuits Digest of Technical Papers, pp. 80-81, Jun. 16, 2009.

Arifur Rahman et al.; "Determination of Power Gating Granularity for FPGA Fabric", CICC 2006 :IEEE 2006 Custom Integrated Circuits Conference, pp. 9-12, Sep. 10, 2006.

Hasitha Muthumala Waidyasooriya et al., "Implementation of a Partially Reconfigurable Multi-Context FPGA Based on Asynchronous Architecture," IEICE Trans. Electron. (IEICE Transactions on Electronics), vol. E92-C, No. 4, pp. 539-549; Apr. 2009.

* cited by examiner

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, and an electronic device.

2. Description of the Related Art

A programmable logic device (PLD) includes a plurality of programmable logic elements (PLEs) and a plurality of programmable routing switches (PRS's). In the PLD, data on the function of each PLE and data on connection between the PLEs by PRS's are stored as configuration data in a configuration memory. In other words, the PLD stores its circuit structure as configuration data.

A multi-context reconfigurable device is suggested (e.g., Non-Patent Document 1). In the multi-context reconfigurable device, the circuit structure of the PLD is changed by storing a plurality of sets of configuration data corresponding to circuit structures in the PLD and changing configuration data to be used. Configuration data representing a circuit structure is referred to as context. Furthermore, switching of the circuit structure of a PLD is referred to as context switch.

A structure of a multi-context reconfigurable device has been suggested in recent years, in which a transistor including an oxide semiconductor in a semiconductor layer including a channel formation region (OS transistor) and a transistor including silicon in a semiconductor layer including a channel formation region (Si transistor) are combined to be used as a memory that stores configuration data (e.g., Patent Document 1).

REFERENCE

Patent Document

[Patent Document 1] Japanese Published Patent Application No. 2015-27080

Non-Patent Documents

[Non-Patent Document 1] H. M. Waidyasooriya et al., "Implementation of a Partially Reconfigurable Multi-Context FPGA Based on Asynchronous Architecture," IEICE Transactions on Electronics, Vol. E92-C, 2009, pp. 539-549.

[Non-Patent Document 2] D. Suzuki et al., "Fabrication of a 3000-6-Input-LUTs Embedded and Block-Level Power-Gated Nonvolatile FPGA Chip Using p-MTJ-Based Logic-in-Memory Structure," Dig. Symp. VLSI Circuits, June 2015, pp. 172-173.

[Non-Patent Document 3] S. Masui et al., "A Ferroelectric Memory-Based Secure Dynamically Programmable Gate Array," J. Solid-State Circuit, vol. 38, no. 5, May 2003, pp. 715-725.

[Non-Patent Document 4] T. Aoki et al., "Normally-Off Computing with Crystalline InGaZnO-based FPGA," IEEE ISSCC Dig. Tech. Papers, February 2014, pp. 502-504.

SUMMARY OF THE INVENTION

To achieve lower power consumption, faster operation, or higher integration of a semiconductor device, a semiconductor element such as a transistor used in the semiconductor device needs to be reduced in size. As the size of transistors is reduced, the thickness of a gate insulating film is also reduced according to the scaling law. With a thinner gate insulating film, tunneling current occurs and thus leakage current flowing between a gate and a semiconductor layer increases.

The semiconductor device in Patent Document 1 (e.g., in FIG. 5B) retains data by accumulating charge at a node between the OS transistor and the Si transistor. In such a semiconductor device, when leakage current of the Si transistor increases because of reduction in size of the semiconductor device, the accumulated charge easily leaks and it becomes difficult to ensure a long data retention time.

In the case where the thickness of a gate insulating film of a transistor is increased in order to give priority to holding of charge, the amount of current flowing through the transistor might be decreased in some cases. In this case, context switch takes time if a load of a circuit that changes a logic in the context switch is large. That is, an advantage of a multi-context reconfigurable device that enables high-speed context switch might be lost.

An object of one embodiment of the present invention is to provide a semiconductor device that allows a long data retention time. Another object of one embodiment of the present invention is to provide a semiconductor device that allows reduction in power consumption. Another object of one embodiment of the present invention is to provide a semiconductor device that allows a short context switch time while normal operation is ensured.

One embodiment of the present invention is a semiconductor device including a first charge retention circuit, a second charge retention circuit, a first switch, a second switch, and a buffer circuit. The first charge retention circuit and the second charge retention circuit each include a first transistor and a second transistor. The first transistor and the second transistor each include an oxide semiconductor in a semiconductor layer serving as a channel formation region. One of a source and a drain of the first transistor is electrically connected to a gate of the second transistor. One of a source and a drain of the second transistor is electrically connected to one terminal of the first switch or one terminal of the second switch. The other terminal of the first switch is electrically connected to the other terminal of the second switch. The other terminal of the first switch and the other terminal of the second switch are electrically connected to an input terminal of the buffer circuit. Electrostatic capacitance of the one terminal of the first switch is larger than electrostatic capacitance of the input terminal of the buffer circuit. Electrostatic capacitance of the one terminal of the second switch is larger than the electrostatic capacitance of the input terminal of the buffer circuit.

In the semiconductor device of one embodiment of the present invention, turning on or off of each of the first switch and the second switch is preferably controlled by a context switch signal.

In the semiconductor device of one embodiment of the present invention, the first switch and the second switch preferably each include a third transistor, and the third transistor preferably includes silicon in a semiconductor layer serving as a channel formation region.

In the semiconductor device of one embodiment of the present invention, the first transistor and the second transistor are preferably provided over the third transistor.

The semiconductor device of one embodiment of the present invention preferably further includes a first capacitor and a second capacitor. Electrostatic capacitance of the first capacitor is preferably the electrostatic capacitance of the one terminal of the first switch. Electrostatic capacitance of the second capacitor is preferably the electrostatic capacitance of the one terminal of the second switch. The first capacitor and the second capacitor are preferably provided over the first transistor and the second transistor.

Note that other embodiments of the present invention will be shown in the following embodiments and the drawings.

According to one embodiment of the present invention, a semiconductor device that allows a long data retention time can be provided. According to one embodiment of the present invention, a semiconductor device that allows reduction in power consumption can be provided. According to one embodiment of the present invention, a semiconductor device that allows a short context switch time while normal operation is ensured can be provided.

DETAILED DESCRIPTION OF THE INVENTION

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

<Structure of Semiconductor Device>

A structure of a semiconductor device of one embodiment of the present invention is described. Note that the semiconductor device of one embodiment of the present invention functions as a multi-context programmable logic device (PLD).

Figure 1:
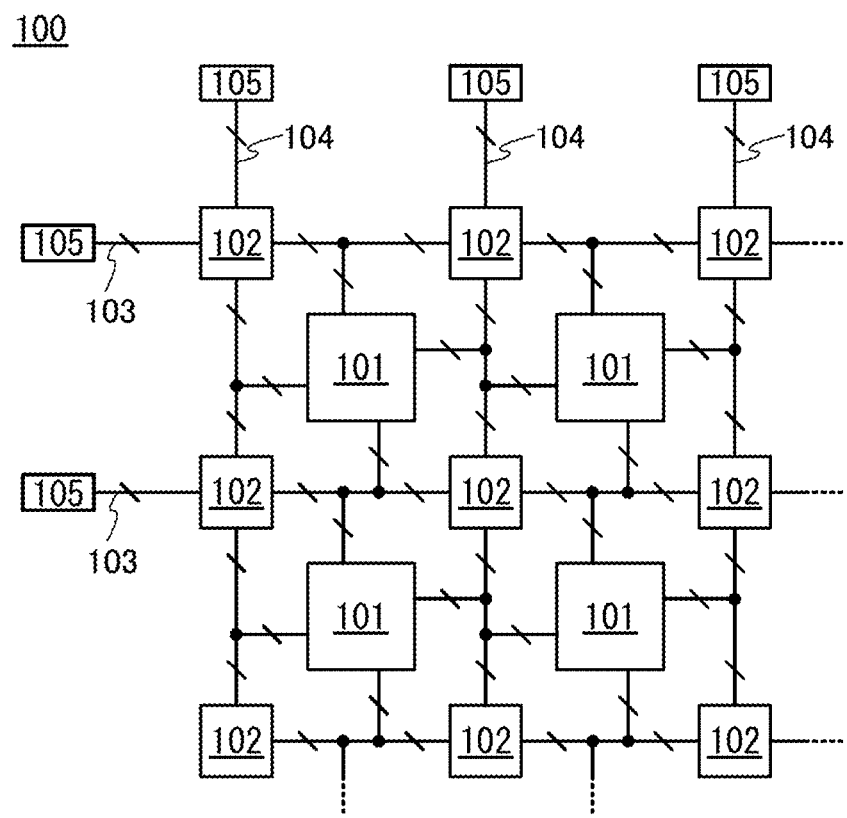
FIG. 1 is a block diagram illustrating a structure example of a semiconductor device.

FIG. 1 is an example of a block diagram of a semiconductor device. A semiconductor device 100 includes a plurality of programmable logic elements (PLEs) 101 arranged in an array. Here, the expression "arranged in an array" means that the PLEs 101 are arranged in a matrix at regular intervals, and the arrangement is not limited to that illustrated in FIG. 1.

A plurality of wirings are formed to surround the PLEs 101. In FIG. 1, these wirings consist of a plurality of horizontal wiring groups 103 and a plurality of vertical wiring groups 104. A wiring group is a bundle of a plurality of wirings. Programmable routing switches (PRS's) 102 are provided at intersections of the horizontal wiring groups 103 and the vertical wiring groups 104. The horizontal wiring groups 103 and the vertical wiring groups 104 are connected to input-output terminals 105 and a signal is received from and transmitted to an external circuit of the semiconductor device 100.

Input terminals and output terminals of the plurality of PLEs 101 are connected to the horizontal wiring groups 103 and the vertical wiring groups 104 provided around the PLEs 101. For example, in FIG. 1, the input terminals and the output terminals of the PLEs 101 are connected to the horizontal wiring groups 103 and the vertical wiring groups 104 on the left, right, top, and bottom sides. With the use of these input terminals and output terminals, one PLE 101 can be connected to another PLE 101. A connection path from one PLE 101 to another PLE 101 is determined by a switch for switching connection between wirings provided in the PRS 102.

Turning on or off of the switch for switching connection between wirings in the PRS 102 is determined in accordance with configuration data stored in a configuration memory. In the case of a rewritable structure, the configuration memory provided in the PRS 102 preferably includes a nonvolatile memory element to prevent loss of the stored configuration data due to a stop of supply of power supply voltage.

Figure 2:
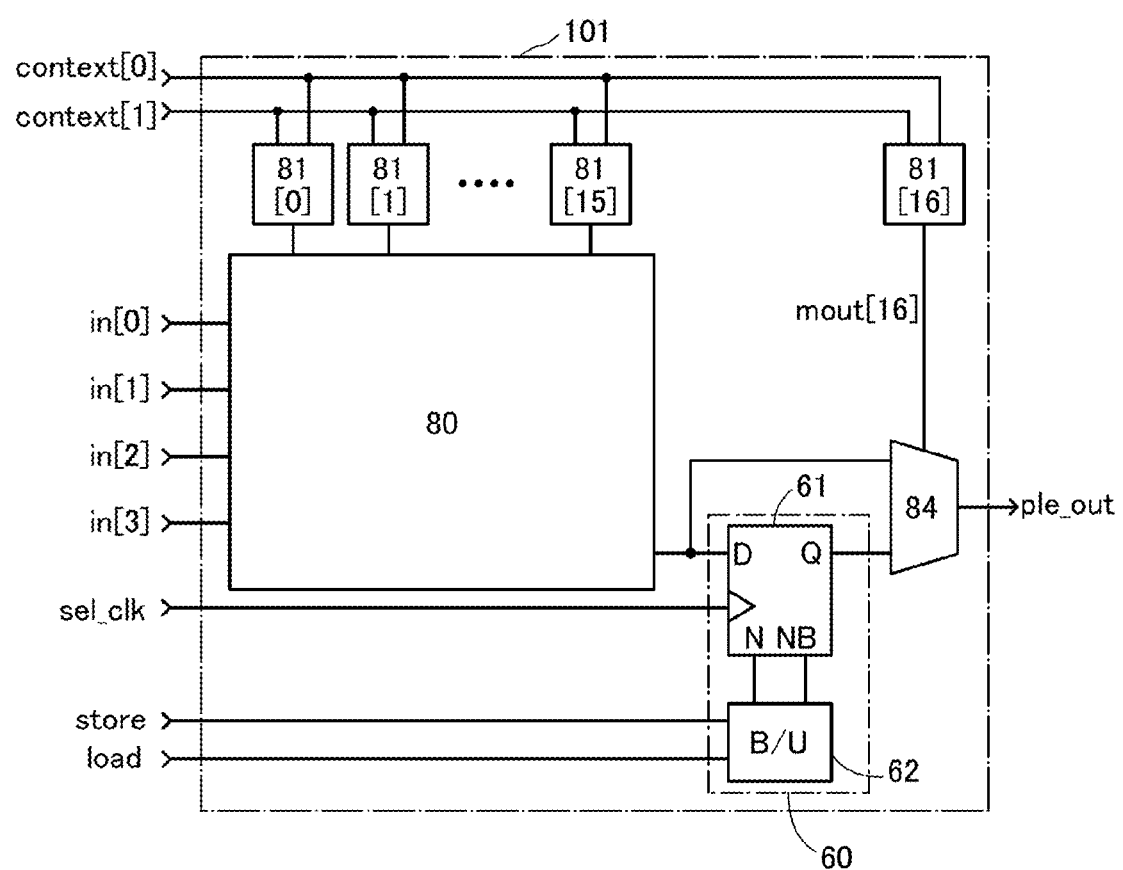
FIG. 2 is a block diagram illustrating a structure example of a semiconductor device.

FIG. 2 is a block diagram of the PLE 101 in FIG. 1. The PLE 101 illustrated in FIG. 2 includes, for example, a look-up table 80, a multiplexer 84, configuration memories 81[0] to 81[16], and a flip-flop 60 with a backup function. The flip-flop 60 with a backup function includes a flip-flop 61 and a backup circuit 62.

Although the flip-flop 60 with a backup function is provided as a flip-flop included in the PLE 101 in FIG. 2, a flip-flop does not necessarily have a backup function. In other words, the backup circuit 62 can be omitted.

Signals in[0] to in[3] are input to the look-up table 80 from another PLE 101 or the like. An output signal of the look-up table 80 is output to a data input terminal of the flip-flop 61 and an input terminal of the multiplexer 84.

Although the look-up table 80 is a 4-input look-up table here, one embodiment of the present invention is not limited thereto. For example, the look-up table 80 may be a 6-input look-up table or a p-input look-up table (p is an integer of 2 or more).

Signals context[0] and context[1] are input to the configuration memories 81[0] to 81[16] from a context controller. Output signals of the configuration memories 81[0] to 81[15] are output to the look-up table 80. An output signal of the configuration memory 81[16] is output to a selection signal input terminal of the multiplexer 84.

The flip-flop 60 with a backup function has a function of performing either retention or output to a second input terminal of the multiplexer 84, of an output signal of the look-up table 80, depending on the logic of a selection clock signal sel_clk. The multiplexer 84 has a function of outputting, as an output signal ple_out, one of the logic of a signal output from the look-up table 80 and the logic of a signal output from a data output terminal of the flip-flop 60, depending on the logic of a signal output from the configuration memory 81[16].

An output signal of the flip-flop 61 is output to the input terminal of the multiplexer 84. The selection clock signal sel_clk is input to a clock input terminal of the flip-flop 61. An output signal of the multiplexer 84 is the output signal ple_out.

Data writing and data reading in the backup circuit 62 are controlled by a backup data write signal store and a backup data read signal load. An output signal and an inverted output signal of the flip-flop 61 are input to the backup circuit 62 in response to the backup data write signal store. An output signal of the backup circuit 62 is output to an output terminal and an inverted output terminal of the flip-flop 61 in response to the backup data read signal load.

A configuration memory that can be used as each of the configuration memories 81[0] to 81[16] in FIG. 2 of one embodiment of the present invention is described with reference to FIG. 3.

Figure 3:
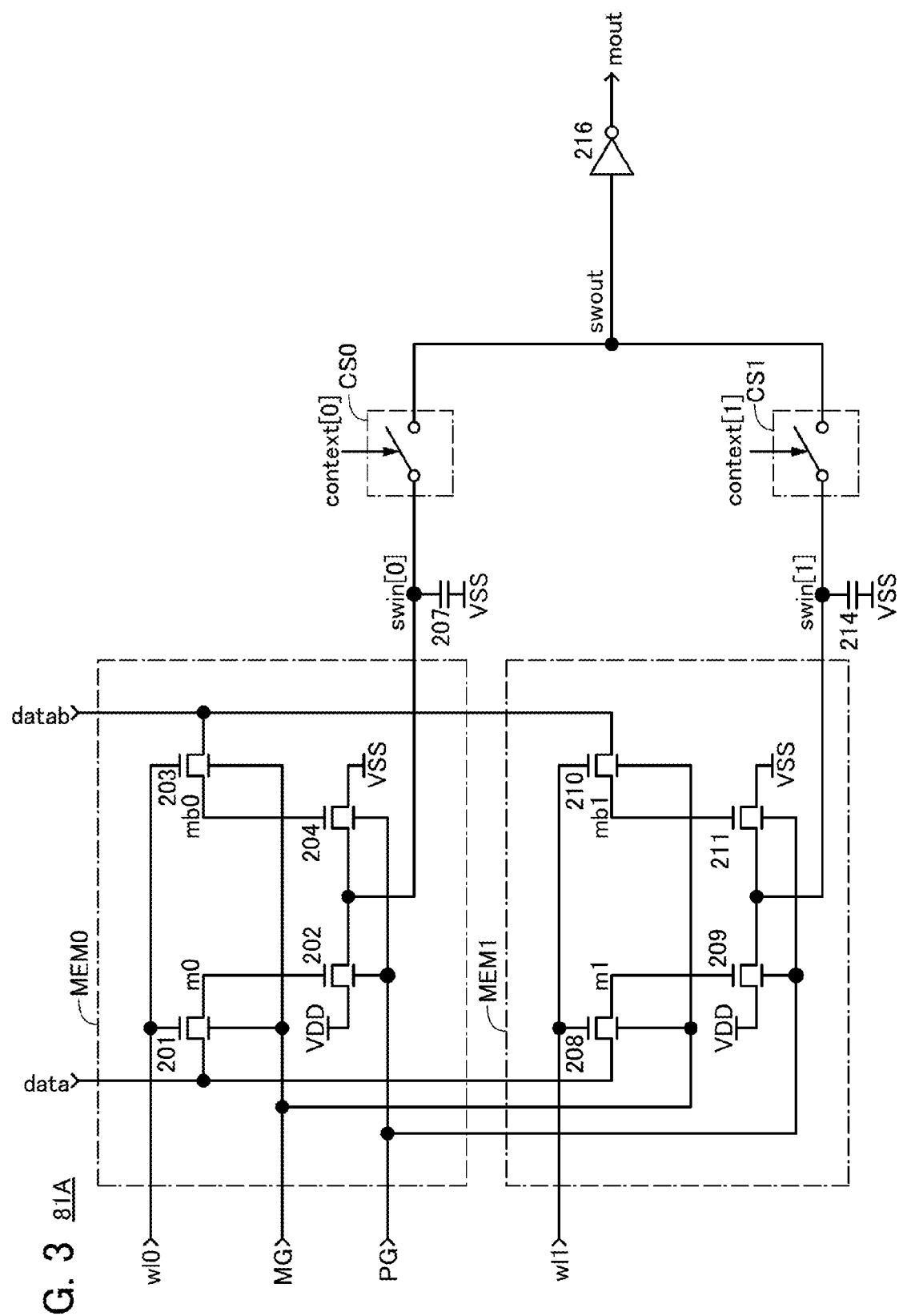
FIG. 3 is a circuit diagram illustrating a structure example of a semiconductor device.

A configuration memory 81A illustrated in FIG. 3 includes a charge retention circuit MEM0, a charge retention circuit MEM1, a switch CS0, a switch CS1, a capacitor 207, a capacitor 214, and a buffer circuit 216 formed using an inverter circuit.

The charge retention circuit MEM0 includes a transistor 201, a transistor 202, a transistor 203, and a transistor 204.

A gate of the transistor 201 is connected to a write control signal line wl0. One of a source and a drain of the transistor 201 is connected to a data line data. The other of the source and the drain of the transistor 201 is connected to a gate of the transistor 202. A back gate of the transistor 201 is connected to a threshold control line MG. A node at which the other of the source and the drain of the transistor 201 and the gate of the transistor 202 are connected is referred to as a node m0.

One of a source and a drain of the transistor 202 is connected to a high potential power supply line VDD. The other of the source and the drain of the transistor 202 is connected to a context switch input signal line swin[0]. A back gate of the transistor 202 is connected to a threshold control line PG. The context switch input signal line swin[0] is connected to one terminal of the switch CS0.

A gate of the transistor 203 is connected to the write control signal line wl0. One of a source and a drain of the transistor 203 is connected to a data line datab. The other of the source and the drain of the transistor 203 is connected to a gate of the transistor 204. A back gate of the transistor 203 is connected to the threshold control line MG. A node at which the other of the source and the drain of the transistor 203 and the gate of the transistor 204 are connected is referred to as a node mb0.

One of a source and a drain of the transistor 204 is connected to a low potential power supply line VSS. The other of the source and the drain of the transistor 204 is connected to the context switch input signal line swin[0]. A back gate of the transistor 204 is connected to the threshold control line PG.

The transistor 201 writes the potential of the data line data to the node m0 when the potential of the write control signal line wl0 is at a high level. The transistor 201 has a function of retaining charge corresponding to the potential of the node m0 when the potential of the write control signal line wl0 is at a low level. Note that the threshold voltage of the transistor 201 is controlled, by the potential of the threshold control signal line MG connected to its back gate, so that leakage current in an off state (off-state current) is extremely small.

The transistor 202 has a function of controlling whether the potential of the high potential power supply line VDD is supplied to the context switch input signal line swin[0] depending on the potential of the node m0. Note that the transistor 202 is controlled, by the potential of the threshold control signal line PG connected to its back gate, so that drain current in an on state (on-state current) is large.

The transistor 203 writes the potential of the data line datab to the node mb0 when the potential of the write control signal line wl0 is at a high level. The transistor 203 has a function of retaining charge corresponding to the potential of the node mb0 when the potential of the write control signal line wl0 is at a low level. Note that the threshold voltage of the transistor 203 is controlled, by the potential of the threshold control signal line MG connected to its back gate, so that off-state current is extremely small.

The transistor 204 has a function of controlling whether the potential of the low potential power supply line VSS is supplied to the context switch input signal line swin[0] depending on the potential of the node mb0. Note that the transistor 204 is controlled, by the potential of the threshold control signal line PG connected to its back gate, so that on-state current is large.

As each of the transistors 201 and 203, for example, a transistor with an extremely small off-state current, such as an OS transistor, is used. With such a structure, data corresponding to the potentials retained at the node m0 and the node mb0 can keep being retained while the transistors 201 and 203 are in an off state.

An OS transistor can be used at a higher temperature than a Si transistor. In addition, the OS transistor has a higher breakdown voltage than the Si transistor. Accordingly, a circuit with high reliability regardless of a change in the environment can be provided. The electrical characteristics of the OS transistor are described later.

As each of the transistors 202 and 204, for example, an OS transistor that includes a thicker gate insulating film than that of a Si transistor is used. With such a structure, in each of the transistors 202 and 204, leakage current that flows between its gate and semiconductor layer due to generation of tunneling current caused by a thin gate insulating film can be prevented. Accordingly, data corresponding to the potentials retained at the node m0 and the node mb0 can keep being retained.

Each of the nodes m0 and mb0 may be provided with a capacitor to increase a function of retaining charge.

The charge retention circuit MEM1 includes a transistor 208, a transistor 209, a transistor 210, and a transistor 211.

A gate of the transistor 208 is connected to a write control signal line wl1. One of a source and a drain of the transistor 208 is connected to the data line data. The other of the source and the drain of the transistor 208 is connected to a gate of the transistor 209. A back gate of the transistor 208 is connected to the threshold control line MG. A node at which the other of the source and the drain of the transistor 208 and the gate of the transistor 209 are connected is referred to as a node m1.

One of a source and a drain of the transistor 209 is connected to a high potential power supply line VDD. The other of the source and the drain of the transistor 209 is connected to a context switch input signal line swin[1]. A back gate of the transistor 209 is connected to the threshold control line PG. The context switch input signal line swin[1] is connected to one terminal of the switch CS1.

A gate of the transistor 210 is connected to the write control signal line wl1. One of a source and a drain of the transistor 210 is connected to the data line datab. The other of the source and the drain of the transistor 210 is connected to a gate of the transistor 211. A back gate of the transistor 210 is connected to the threshold control line MG. A node at which the other of the source and the drain of the transistor 210 and the gate of the transistor 211 are connected is referred to as a node mb1.

One of a source and a drain of the transistor 211 is connected to a low potential power supply line VSS. The other of the source and the drain of the transistor 211 is connected to the context switch input signal line swin[1]. A back gate of the transistor 211 is connected to the threshold control line PG.

The transistor 208 writes the potential of the data line data to the node m1 when the potential of the write control signal line wl1 is at a high level. The transistor 208 has a function of retaining charge corresponding to the potential of the node m1 when the potential of the write control signal line wl1 is at a low level. Note that the threshold voltage of the transistor 208 is controlled, by the potential of the threshold control signal line MG connected to its back gate, so that off-state current is extremely small.

The transistor 209 has a function of controlling whether the potential of the high potential power supply line VDD is supplied to the context switch input signal line swin[1] depending on the potential of the node m1. Note that the transistor 209 is controlled, by the potential of the threshold control signal line PG connected to its back gate, so that on-state current is large.

The transistor 210 writes the potential of the data line datab to the node mb1 when the potential of the write control signal line wl1 is at a high level. The transistor 210 has a function of retaining charge corresponding to the potential of the node mb1 when the potential of the write control signal line wl1 is at a low level. Note that the threshold voltage of the transistor 210 is controlled, by the potential of the threshold control signal line MG connected to its back gate, so that off-state current is extremely small.

The transistor 211 has a function of controlling whether the potential of the low potential power supply line VSS is supplied to the context switch input signal line swin[1] depending on the potential of the node mb1. Note that the transistor 211 is controlled, by the potential of the threshold control signal line PG connected to its back gate, so that on-state current is large.

As each of the transistors 208 and 210, for example, a transistor with an extremely small off-state current, such as an OS transistor, is used. With such a structure, data corresponding to the potentials retained at the node m1 and the node mb1 can keep being retained while the transistors 208 and 210 are in an off state.

As each of the transistors 209 and 211, for example, an OS transistor that includes a thicker gate insulating film than that of a Si transistor is used. With such a structure, in each of the transistors 209 and 211, leakage current that flows between its gate and semiconductor layer due to generation of tunneling current caused by a thin gate insulating film can be prevented. Accordingly, data corresponding to the potentials retained at the node m1 and the node mb1 can keep being retained.

Each of the nodes m1 and mb1 may be provided with a capacitor to increase a function of retaining charge.

The switch CS0 has a function of electrically connecting the context switch input signal line swin[0] and a context switch output signal line swout when the potential of the context selection signal context[0] is at a high level. The switch CS0 has a function of electrically disconnecting the context switch input signal line swin[0] and the context switch output signal line swout when the potential of the context selection signal context[0] is at a low level.

The switch CS1 has a function of electrically connecting the context switch input signal line swin[1] and the context switch output signal line swout when the potential of the context selection signal context[1] is at a high level. The switch CS1 has a function of electrically disconnecting the context switch input signal line swin[1] and the context switch output signal line swout when the potential of the context selection signal context[1] is at a low level.

The capacitor 207 is illustrated in FIG. 3. One electrode of the capacitor 207 is connected to the context switch input signal line swin[0], and the other electrode is connected to a low potential power supply line VSS. The capacitor 207 can be omitted when the parasitic capacitance of the context switch input signal line swin[0] is increased.

The capacitor 214 is illustrated in FIG. 3. One electrode of the capacitor 214 is connected to the context switch input signal line swin[1], and the other electrode is connected to a low potential power supply line VSS. The capacitor 214 can be omitted when the parasitic capacitance of the context switch input signal line swin[1] is increased.

The buffer circuit 216 is formed using a complementary Si transistor. An input terminal of the buffer circuit 216 is connected to the context switch output signal line swout. An output terminal of the buffer circuit 216 is connected to an output signal line mout of the configuration memory 81A.

Figure 7:
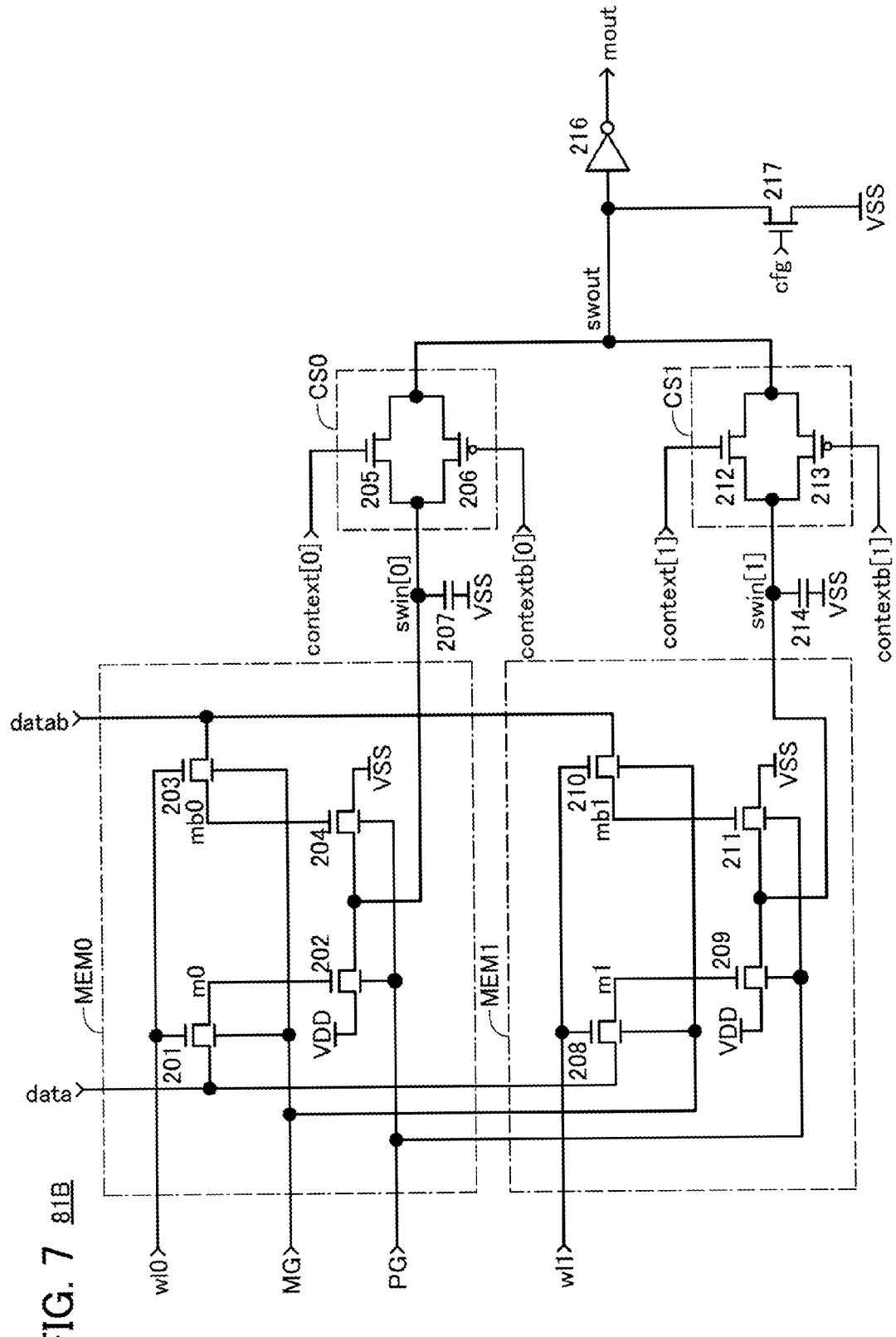
FIG. 7 is a circuit diagram illustrating a structure example of a semiconductor device.

The switch CS0 includes a transistor 205 and a transistor 206, for example, as in a configuration memory 81B illustrated in FIG. 7. The transistor 205 is an n-channel transistor and the transistor 206 is a p-channel transistor. The context selection signal context[0] is supplied to a gate of the transistor 205, and a context selection signal contextb[0] that is an inverted signal of the context selection signal context[0] is supplied to a gate of the transistor 206. Thus, turning on or off of the transistors 205 and 206 can be controlled.

The switch CS1 includes a transistor 212 and a transistor 213, for example, as in the configuration memory 81B illustrated in FIG. 7. The transistor 212 is an n-channel transistor and the transistor 213 is a p-channel transistor. The context selection signal context[1] is supplied to a gate of the transistor 212, and a context selection signal contextb[1] that is an inverted signal of the context selection signal context[1] is supplied to a gate of the transistor 213. Thus, turning on or off of the transistors 212 and 213 can be controlled.

For example, a transistor with a large on-state current, such as a Si transistor, is used as each of the transistors 205, 206, 212, and 213. With such a structure, charge can be distributed at high speed when the switches CS0 and CS1 are turned on.

An OS transistor can be used at a higher temperature than a Si transistor. In addition, the OS transistor has a higher breakdown voltage than the Si transistor. Accordingly, a circuit with high reliability regardless of a change in the environment can be provided. The electrical characteristics of the OS transistor are described later.

For example, a transistor 217 for pulling down the context switch output signal line swout may be connected to the context switch output signal line swout as in the configuration memory 81B illustrated in FIG. 7. The transistor 217 is an n-channel transistor, for example. A gate of the transistor 217 is connected to a wiring that supplies a pull-down enable signal cfg. One of a source and a drain of the transistor 217 is connected to the context switch output signal line swout. The other of the source and the drain of the transistor 217 is connected to a low potential power supply line VSS. The potential of the output signal line mout of the configuration memory 81B can be fixed at a high level when the transistor 217 is provided and the potential of the pull-down enable signal cfg is set at a high level.

The above-described configuration memory 81A in FIG. 3 and configuration memory 81B in FIG. 7 each have a function of outputting a logic (potential) depending on data retained in the charge retention circuit MEM0 or the charge retention circuit MEM1 in response to the context selection signal context[0] (and the context selection signal contextb[0]) and the context selection signal context[1] (and the context selection signal contextb[1]).

The electrostatic capacitance that is enough for charge retention is applied to each of the nodes m0, mb0, m1, and mb1 included in the charge retention circuits MEM0 and MEM1. The smaller the electrostatic capacitance is, the shorter the time required to write configuration data to the charge retention circuits MEM0 and MEM1 can be.

In the structure of each of the configuration memories 81A and 81B of one embodiment of the present invention, in order that the electrostatic capacitance applied to the nodes of the context switch input signal lines swin[0] and swin[1] is larger than the electrostatic capacitance applied to the node of the context switch output signal line swout, the capacitors 207 and 214 are provided. This structure allows the charge retained at the nodes of the context switch input signal line swin[0] or the context switch input signal line swin[1] to be distributed to the node of the context switch output signal line swout through the switch CS0 or the switch CS1 at the time of context switch.

When the potential of the node of the context switch output signal line swout is changed from a low level to a high level due to the distribution of the charge to the context switch output signal line swout, the electrostatic capacitance of each of the capacitors 207 and 214 is adjusted so that the potential of the context switch output signal line swout is higher than the threshold of the inverter circuit that is the buffer circuit 216. In addition, when the potential of the node of the context switch output signal line swout is changed from a high level to a low level due to the distribution of the charge to the context switch output signal line swout, the electrostatic capacitance of each of the capacitors 207 and 214 is adjusted so that the potential of the context switch output signal line swout is lower than the threshold of the inverter circuit that is the buffer circuit 216. In other words, the electrostatic capacitance applied to each of the nodes of the context switch input signal lines swin[0] and swin[1] is made larger than the electrostatic capacitance applied to the node of the context switch output signal line swout.

In the structure of one embodiment of the present invention, an OS transistor including a thicker gate insulating film than that of a Si transistor is used as each of the transistors 202, 204, 209, and 211. Since the OS transistor has a lower field-effect mobility than the Si transistor including a single crystal in a semiconductor layer, the OS transistor has a smaller on-state current than the Si transistor.

In the structure of one embodiment of the present invention, in which the charge is distributed in the above manner, it is possible to change the logic of the inverter circuit that is the buffer circuit 216 even when the on-state current of the transistors 202, 204, 209, and 211 is small. Thus, context switch can be performed at the speed comparable to that in the case where the Si transistors are used as the transistors 202, 204, 209, and 211.

In the case of employing the structure of one embodiment of the present invention, a capacitor with a large electrostatic capacitance is preferably used as each of the capacitors 207 and 214. In this case, it is preferable that a layer where the OS transistors are provided be formed over a layer where the Si transistors are provided and that the capacitors 207 and 214 be provided over the layer where the OS transistors are provided. With this structure, capacitors with a large electrostatic capacitance can be formed in the topmost layer of a device, and the capacitors can be easily connected to the transistors 202, 204, 209, and 211.

<Electrical Characteristics of OS Transistor>

Figure 4A:
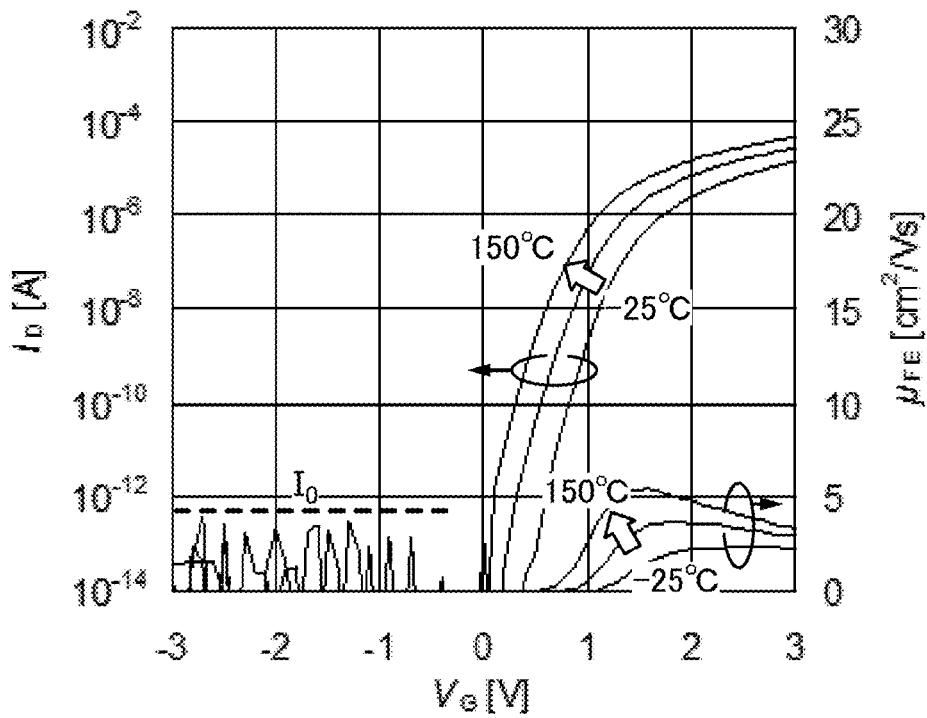
FIGS. 4A and 4B are graphs showing characteristics of transistors.
Figure 4B:
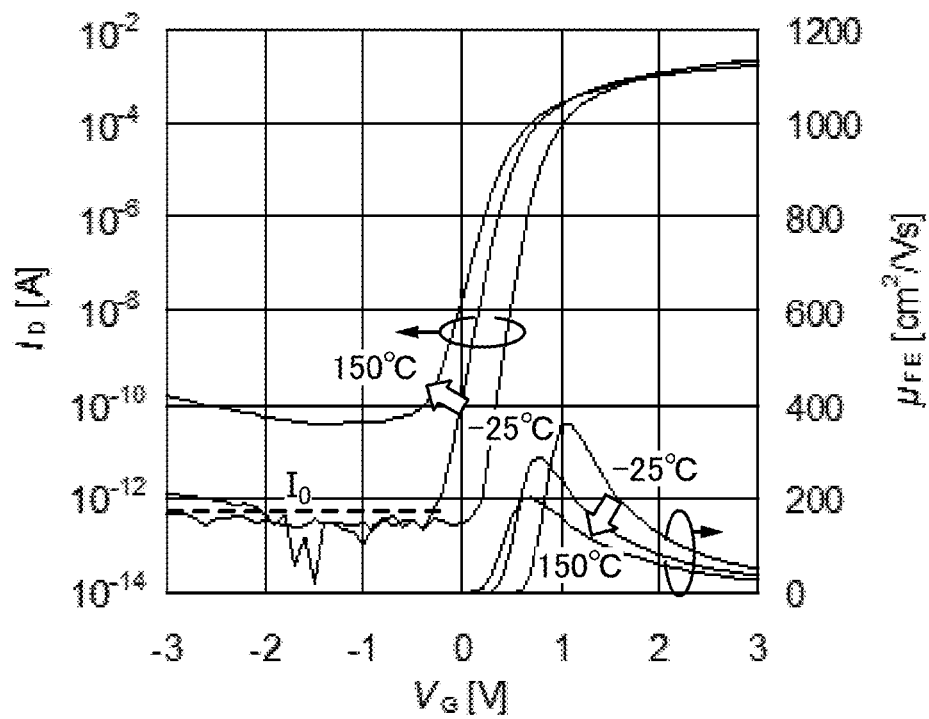

An OS transistor can be used at higher temperatures than a Si transistor. As specific examples, FIG. 4A shows temperature dependence of gate voltage $V_G$-drain current $I_D$ characteristics and gate voltage $V_G$-electric field mobility $\mu_{FE}$ characteristics of an OS transistor, and FIG. 4B shows temperature dependence of gate voltage $V_G$-drain current $I_D$ characteristics and gate voltage $V_G$-electric field mobility $\mu_{FE}$ characteristics of a Si transistor. FIGS. 4A and 4B show measurement results of the electrical characteristics at −25° C., 50° C., and 150° C. Note that the drain voltage $V_D$ is 1 V.

FIG. 4A shows the electrical characteristics of an OS transistor that has a channel length L of 0.45 μm, a channel width W of 10 μm, and a thickness $T_{ox}$ of an oxide film serving as a gate insulating layer of 20 nm. FIG. 4B shows the electrical characteristics of a Si transistor that has L of 0.35 W of 10 μm, and $T_{ox}$ of 20 nm.

An oxide semiconductor layer in the OS transistor is made of an In—Ga—Zn oxide. The Si transistor is formed using a silicon wafer.

FIGS. 4A and 4B show that the rising gate voltage of the OS transistor has low temperature dependence. The off-state current of the OS transistor is smaller than the lower measurement limit ($I_0$) independently of temperature. In contrast, the off-state current of the Si transistor largely depends on the temperature. According to the measurement results of FIG. 4B, at 150° C., the off-state current of the Si transistor increases, and a sufficiently high current on/off ratio cannot be obtained.

According to the graphs in FIGS. 4A and 4B, an OS transistor used as a switch can operate even at 150° C. or higher. Thus, a semiconductor device can have excellent heat resistance.

Next, the breakdown voltage of an OS transistor will be described in comparison with the breakdown voltage of a Si transistor.

Figure 5:
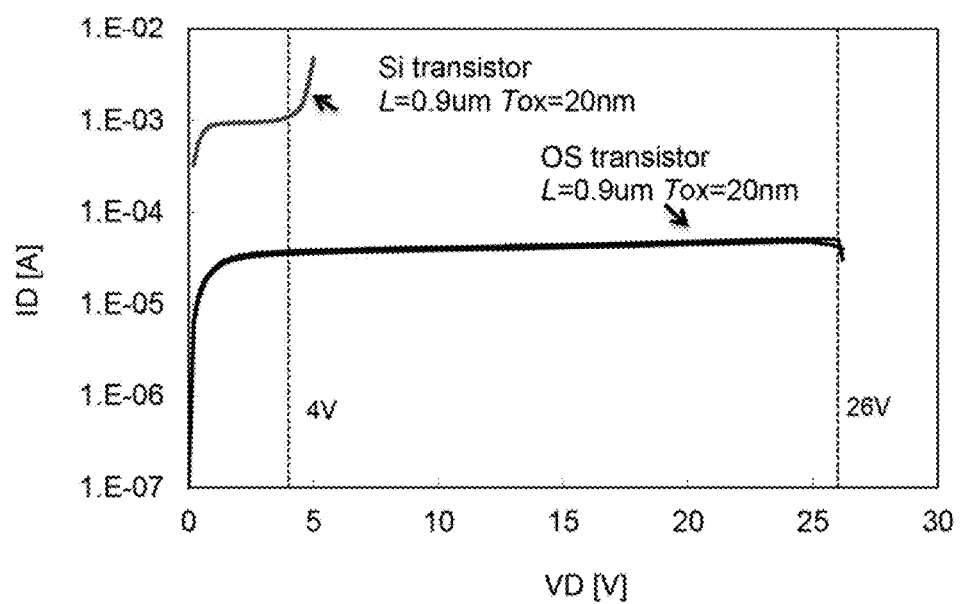
FIG. 5 is a graph showing characteristics of transistors.

FIG. 5 shows $I_D$-$V_D$ curves of a Si transistor and an OS transistor for explaining the drain breakdown voltage of the OS transistor. In FIG. 5, to compare the breakdown voltages of the Si and OS transistors under the same conditions, both of the transistors have a channel length of 0.9 μm, a channel width of 10 μm, and a gate insulating film using silicon oxide with a thickness of 20 nm. Note that the gate voltage is 2 V.

As shown in FIG. 5, avalanche breakdown occurs in the Si transistor at a drain voltage of approximately 4 V, whereas in the OS transistor, a constant current can flow until a drain voltage of approximately 26 V causes avalanche breakdown.

Figure 6A:
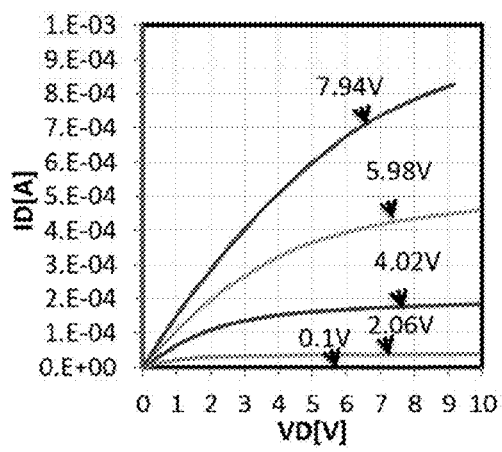
FIGS. 6A and 6B are graphs showing characteristics of transistors.
Figure 6B:
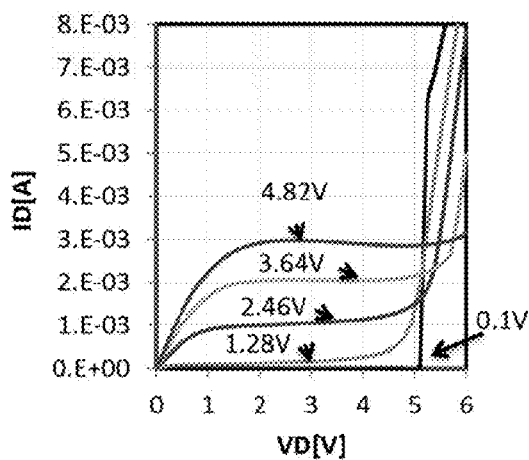

FIG. 6A shows $I_D$-$V_D$ curves of an OS transistor with varying gate voltage. FIG. 6B shows $I_D$-$V_D$ curves of a Si transistor with varying gate voltage. In FIGS. 6A and 6B, to compare breakdown voltages between the Si transistor and the OS transistor under the same conditions, both of the transistors have a channel length of 0.9 μm, a channel width of 10 μm, and a thickness of a gate insulating film using silicon oxide of 20 nm. The gate voltage changes from 0.1 V to 2.06 V, 4.02 V, 5.98 V, and 7.94 V in the OS transistor of FIG. 6A, and changes from 0.1 V to 1.28 V, 2.46 V, 3.64 V, and 4.82 V in the Si transistor of FIG. 6B.

As shown in FIGS. 6A and 6B, avalanche breakdown occurs in the Si transistor at a drain voltage of approximately 4 V to 5 V, whereas in the OS transistor, a constant current can flow at a drain voltage of approximately 9 V without causing avalanche breakdown.

As shown in FIG. 5 and FIGS. 6A and 6B, an OS transistor has a higher breakdown voltage than a Si transistor. Therefore, even when an OS transistor is provided in a portion to which a high voltage is supplied, the OS transistor can operate stably without causing dielectric breakdown.

<Operation of Semiconductor Device>

Figure 8:
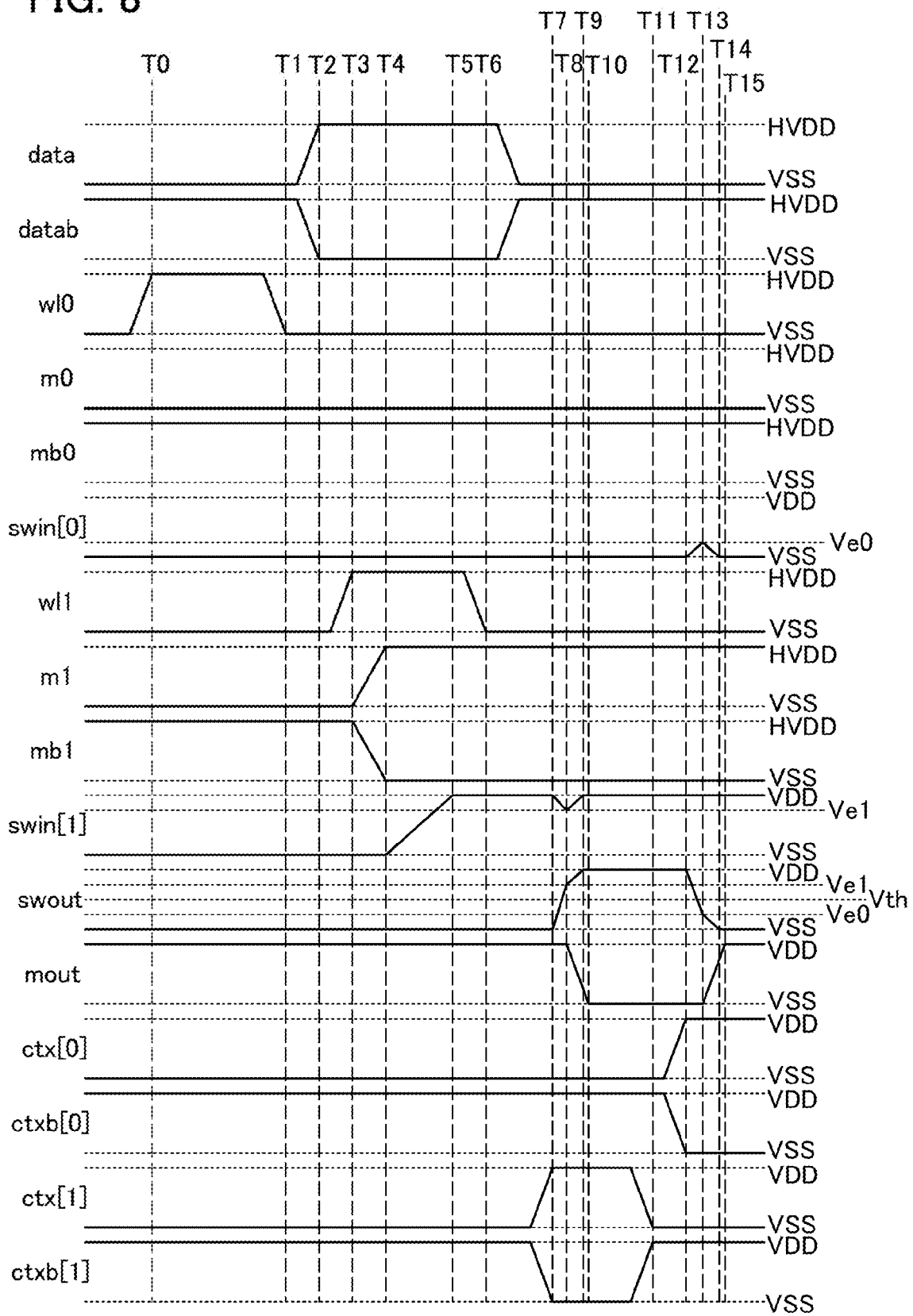
FIG. 8 is a timing chart illustrating an operation example of a semiconductor device.

FIG. 8 is an example of a timing chart for describing operation of a semiconductor device. FIG. 8 shows an example of operation of switching configuration and context of the configuration memory 81B illustrated in FIG. 7.

Note that in the description with reference to FIG. 8, the potentials of the data lines data and datab are referred to as data and datab, respectively; the potentials of the write control signal lines wl0 and wl1 are referred to as wl0 and wl1, respectively; the potentials of the nodes m0 and m1 are referred to as m0 and m1, respectively; the potentials of the nodes mb0 and mb1 are referred to as mb0 and mb1, respectively; the potentials of the context switch input signal lines swin[0] and swin[1] are referred to as swin[0] and swin[1], respectively; the potentials of the context selection signals context[0] and context[1] are referred to as ctx[0] and ctx[1], respectively; the potentials of the context selection signals contextb[0] and contextb[1] are referred to as ctxb[0] and ctxb[1], respectively; the potential of the context switch output signal line swout is referred to as swout; and the potential of the output signal line mout of the configuration memory 81B is referred to as mout.

In the description with reference to FIG. 8, a high-level potential for driving an OS transistor is referred to as HVDD, and a high-level potential for driving a Si transistor is referred to as VDD. Note that HVDD is higher than VDD.

In the description with reference to FIG. 8, a logic expressed by HVDD is referred to as H-high level, a logic expressed by VDD is referred to as high level, and a logic expressed by a potential of the low potential power supply line VSS is referred to as low level.

In the description with reference to FIG. 8, the potential of the pull-down enable signal cfg is at a low level.

In the description with reference to FIG. 8, the threshold value of the voltage at which the logic of the inverter circuit included in the buffer circuit 216 is changed is Vth.

In the description with reference to FIG. 8, a signal of the data line data has a logic that is the inverted logic of a signal of the data line datab; the context selection signal context[0] has a logic that is the inverted logic of the context selection signal contextb[0]; and the context selection signal context[1] has a logic that is the inverted logic of the context selection signal contextb[1].

Here, the configuration operation in which a low-level potential is written to the node m0, an H-high level potential is written to the node mb0, an H-high level potential is written to the node m1, and a low-level potential is written to the node mb1 is described as an example.

In the initial state, m0 is at a low level and mb0 is at an H-high level, so that swin[0] is at a low level. In addition, m1 is at a low level and mb1 is at an H-high level, so that swin[1] is at a low level.

At time T0, writing operation of the charge retention circuit MEM0 is executed as the configuration operation, and wl0 is set at an H-high level. At this time, data is at a low level and datab is at an H-high level, so that m0 and mb0 are not changed from the initial states and swin[0] also remains at a low level.

At time T1, writing completion operation of the charge retention circuit MEM0 is executed. Since wl0 is set at a low level, m0 and mb0 remain at the low level and at the H-high level, respectively. Thus, swin[0] remains at the low level.

At time T2, data and datab are changed to the potentials of data to be written to the nodes m1 and mb1. That is, data is changed to an H-high level potential and datab is changed to a low-level potential.

At time T3, writing operation of the charge retention circuit MEM1 is executed, and wl1 is set at an H-high level. At this time, data is at an H-high level and datab is at a low level, so that an H-high level potential is supplied to the node m1 and a low-level potential is supplied to the node mb1.

At time T4, writing to the nodes m1 and mb1 is completed. The potential of the node m1 is at an H-high level and the potential of the node mb1 is at a low level, so that swin[1] starts to change from the low level to a high level.

At time T5, the potential change of swin[1] is completed, and swin[1] is set at a high level.

At time T6, writing operation and configuration completion operation of the charge retention circuit MEM1 are executed. Since wl1 is set at a low level, m1 remains at the H-high level and mb1 remains at the low level. Thus, swin[1] remains at the high level.

In the charge retention circuits MEM0 and MEM1, the smaller the electrostatic capacitance applied to the nodes m0, mb0, m1, and mb1 is, the higher the speed of the configuration operation can be.

At time T7, context switch operation is executed. Note that context for selecting the context switch input signal line swin[0] and context for selecting the context switch input signal line swin[1] are referred to as context 0 and context 1, respectively. Here, the context 1 is selected first. In this case, ctx[1] is set at a high level and ctxb[1] is set at a low level.

The switch CS1 is turned on, so that the context switch input signal line swin[1] and the context switch output signal line swout become electrically continuous to each other. As a result of the configuration, swin[1] remains at the high level, whereby a high-level potential is supplied to the context switch output signal line swout. During a period from time T7 to time T8, the charge retained at the node of the context switch input signal line swin[1] is distributed to the node of the context switch output signal line swout through the Si transistors, so that swout is changed to a potential Ve1 at a switching speed of the Si transistors.

Although supply of VDD through the transistor 209 during the period from time T7 to time T8 is not considered here, the switching speed is further increased when it is considered.

When the ratio between the electrostatic capacitances is adjusted so that the potential Ve1 is higher than the threshold value Vth of the inverter circuit included in the buffer circuit 216, mout can be changed to a low-level potential at high speed.

At time T8, the charge distribution is completed. Then, VDD is supplied through the transistor 209, whereby swin[1] and swout are each changed to a high-level potential at a switching speed of the transistors by time T9.

At time T10, the context switch operation is completed.

At time T11, the context switch operation is executed again. This time, the context 0 is selected. Since ctx[1] is set at a low level, ctxb[1] is set at a high level, and the switch CS1 is turned off, the context switch input signal line swin[1] and the context switch output signal line swout become electrically discontinuous to each other.

At time T12, ctx[0] is set at a high level and ctxb[0] is set at a low level.

The switch CS0 is turned on, so that the context switch input signal line swin[0] and the context switch output signal line swout become electrically continuous to each other. As a result of the configuration, swin[0] remains at the low level, whereby a low-level potential is supplied to the context switch output signal line swout. During a period from time T12 to time T13, the charge retained at the node of the context switch output signal line swout is distributed to the node of the context switch input signal line swin[0] through the Si transistors, so that swout is changed to a potential Ve0 at a switching speed of the Si transistors.

Although supply of VSS through the transistor 204 during the period from time T12 to time T13 is not considered here, the switching speed is further increased when it is considered.

When the ratio between the electrostatic capacitances is adjusted so that the potential Ve0 is lower than the threshold value Vth of the inverter circuit included in the buffer circuit 216, mout can be changed to a high-level potential at high speed.

At time T13, the charge distribution is completed. Then, VSS is supplied through the transistor 204, whereby swin[0] and swout are each changed to a low-level potential at a switching speed of the transistors by time T14.

At time T15, the context switch operation is completed.

Smaller electrostatic capacitance applied to each of the nodes m0, mb0, m1, and mb1 can reduce time required for writing to the charge retention circuits MEM0 and MEM1 during a period from time T3 to time T4.

Until the logic of swin[0] and/or the logic of swin[1] are changed, there is enough time for an interval between write control signals in a period from time T1 to time T3 and for a period from the configuration completion operation to the start of context selection in a period from time T6 to time T7. Although high speed is required for context switch, the context switch is not performed frequently, or at intervals of a several clock, in general. Thus, there is enough time for swin[1] and swout to be changed to a high-level potential in a period from time T8 to time T9 and for swin[0] and swout to be changed to a low-level potential in a period from time T13 to time T14. Accordingly, the operation speed of the semiconductor device is hardly affected even when transistors are used to supply charge to the context switch input signal lines swin[0] and swin[1].

Thus, electrostatic capacitance larger than the electrostatic capacitance of each of the nodes m0, mb0, m1, and mb1, and the context switch output signal line swout is provided for each of the context switch input signal lines swin[0] and swin[1], so that a configuration memory including an OS transistor can perform high-speed context switch operation.

<Structure of Look-Up Table 80>

Figure 9:
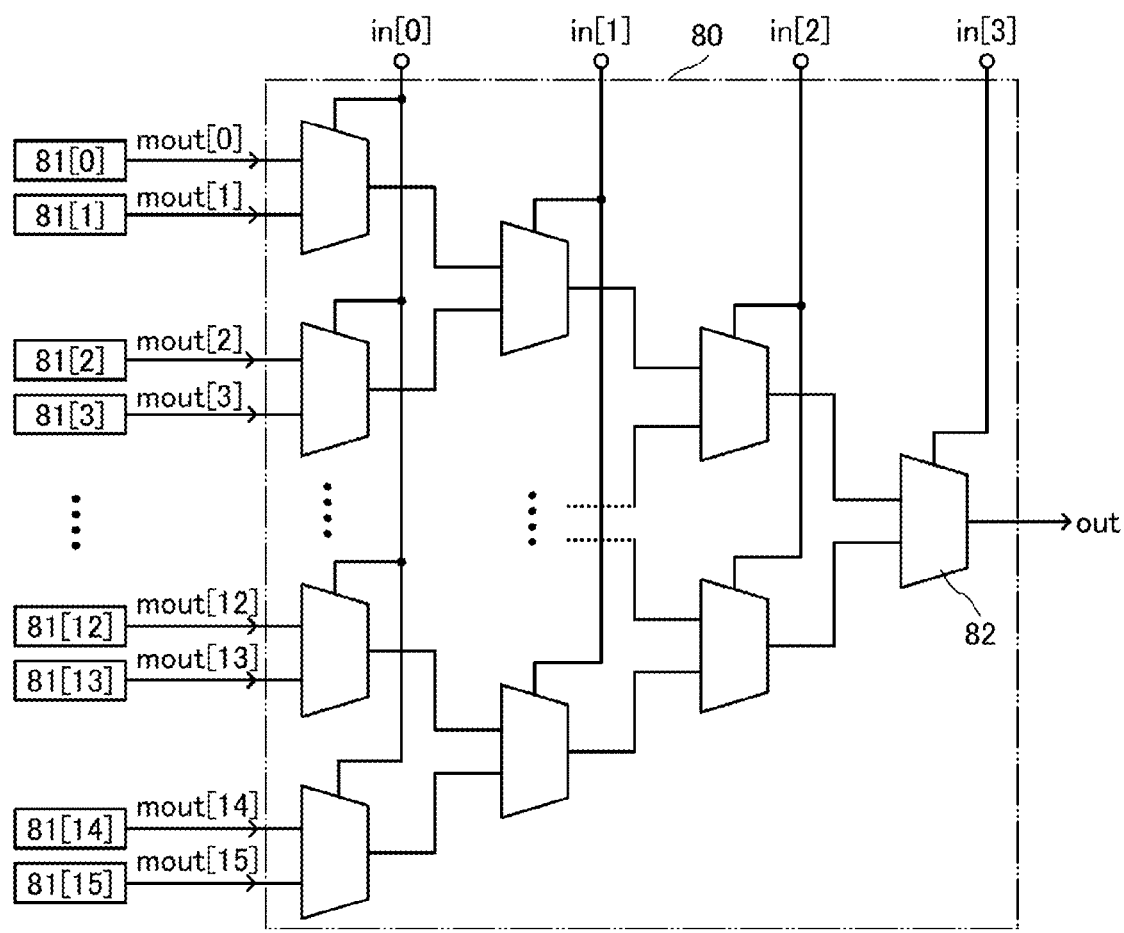
FIG. 9 is a circuit diagram illustrating a structure example of a semiconductor device.

FIG. 9 illustrates a structure example of the look-up table 80 illustrated in FIG. 2. The look-up table 80 includes a plurality of switch circuits 82 and outputs, as an output signal out, one of output signals mout[0] to mout[15] of the configuration memories 81[0] to 81[15] according to the logics of the signals in[0] to in[3], as illustrated in FIG. 9. The configuration memories 81[0] to 81[16] each retain configuration data and output a signal corresponding to the retained configuration data.

<Structure of Flip-Flop 60 with Backup Function>

Figure 10:
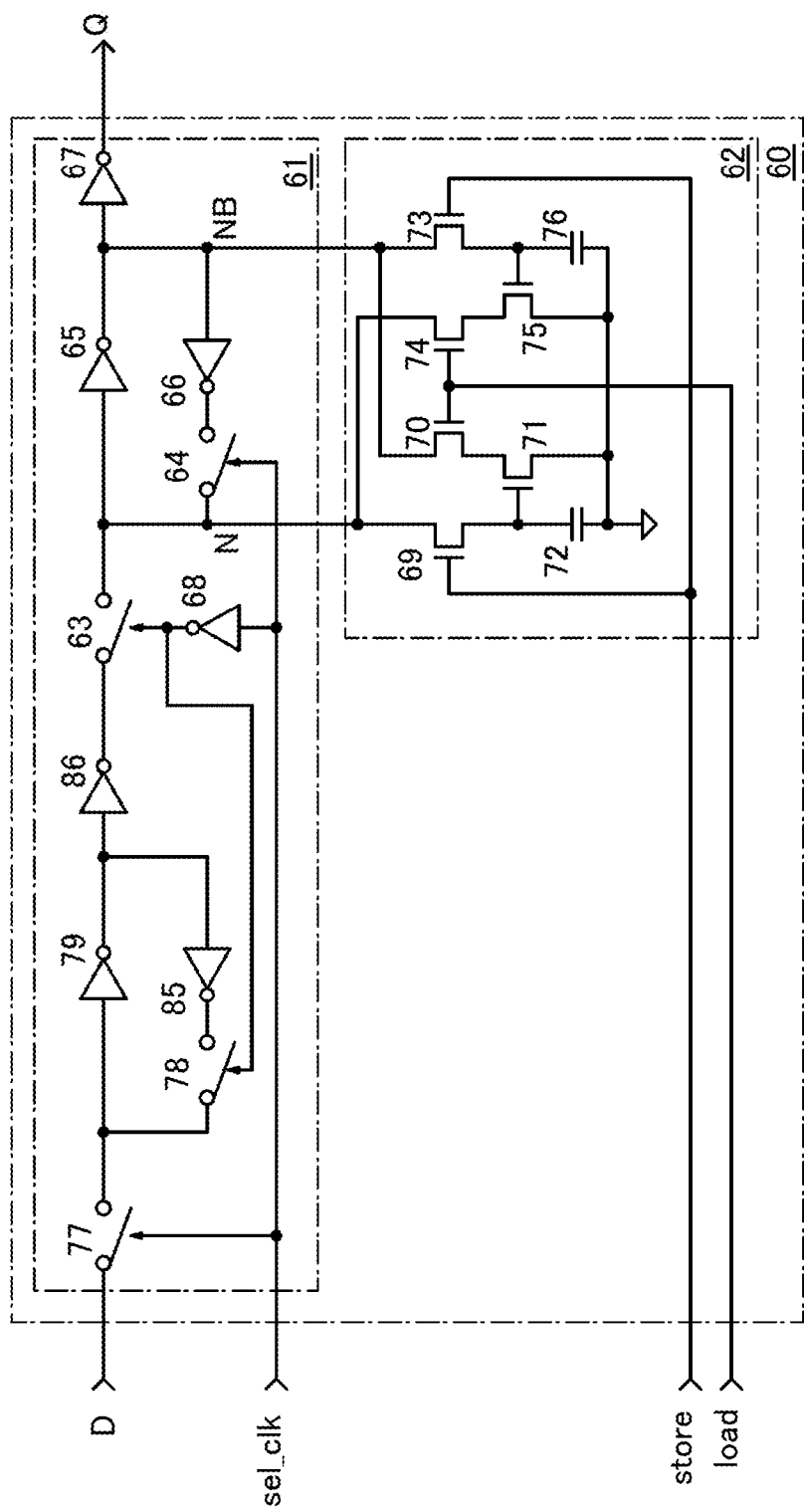
FIG. 10 is a circuit diagram illustrating a structure example of a semiconductor device.

FIG. 10 illustrates a structure example of the flip-flop 60 with a backup function, which is illustrated in FIG. 2.

The flip-flop 60 with a backup function includes the flip-flop 61 and the backup circuit 62. The flip-flop 61 includes a node N, a node NB, a switch 63, a switch 64, an inverter circuit 65, an inverter circuit 66, an inverter circuit 67, an inverter circuit 68, a switch 77, a switch 78, an inverter circuit 79, an inverter circuit 85, and an inverter circuit 86. The backup circuit 62 includes a transistor 69, a transistor 70, a transistor 71, a capacitor 72, a transistor 73, a transistor 74, a transistor 75, and a capacitor 76.

The on/off state of each of the switch 63, the switch 64, the switch 77, and the switch 78 is controlled by the selection clock signal sel_clk. Here, each of the switch 63, the switch 64, the switch 77, and the switch 78 is turned on when the selection clock signal sel_clk is at a high level, and each of the switch 63, the switch 64, the switch 77, and the switch 78 is turned off when the selection clock signal sel_clk is at a low level.

The flip-flop 61 takes data D when the selection clock signal sel_clk is set at a high level and then is set at a low level. The flip-flop 61 continues to retain the taken data D as an output signal Q by maintaining the on state of the switch 64.

A wiring to which the backup data write signal store is input and a gate terminal of the transistor 73 are connected to a gate terminal of the transistor 69. A node N in the flip-flop 61 is connected to one of a source terminal and a drain terminal of the transistor 69. A gate terminal of the transistor 71 and one terminal of the capacitor 72 are connected to the other of the source terminal and the drain terminal of the transistor 69.

A wiring to which the backup data read signal load is input and a gate terminal of the transistor 74 are connected to a gate terminal of the transistor 70. One of a source terminal and a drain terminal of the transistor 70 is connected to the node NB in the flip-flop 61, and the other of the source terminal and the drain terminal of the transistor 70 is connected to one of a source terminal and a drain terminal of the transistor 71.

A ground potential is applied to the other of the source terminal and the drain terminal of the transistor 71.

The ground potential is applied to the other terminal of the capacitor 72.

The wiring to which the backup data write signal store is input and the gate terminal of the transistor 69 are connected to the gate terminal of the transistor 73. A node NB in the flip-flop 61 is connected to one of a source terminal and a drain terminal of the transistor 73. A gate terminal of the transistor 75 and one terminal of the capacitor 76 are connected to the other of the source terminal and the drain terminal of the transistor 73.

The wiring to which the backup data read signal load is input and the gate terminal of the transistor 70 are connected to the gate terminal of the transistor 74. The node NB in the flip-flop 61 is connected to one of a source terminal and a drain terminal of the transistor 74. One of a source terminal and a drain terminal of the transistor 75 is connected to the other of the source terminal and the drain terminal of the transistor 74.

The ground potential is applied to the other of the source terminal and the drain terminal of the transistor 75.

The ground potential is applied to the other terminal of the capacitor 76.

Each of the transistors 69 and 74 has an extremely small leakage current in an off state (off-state current). A transistor whose channel formation region includes an oxide semiconductor layer (an OS transistor) is preferably used as such a transistor. When an OS transistor is used as each of the transistors 69 and 74, it is possible to retain a potential based on the charge retained in the capacitors 72 and 76 by maintaining the off state of each of the transistors 69 and 74.

<Cross-Sectional Structure of Semiconductor Device>

Next, an example of a cross-sectional structure of a semiconductor device is described with reference to FIG. 11, FIGS. 12A and 12B, and FIGS. 13A and 13B.

The above semiconductor device can be manufactured by stacking a layer including a Si transistor, a layer including an OS transistor, and a wiring layer.

Figure 11:
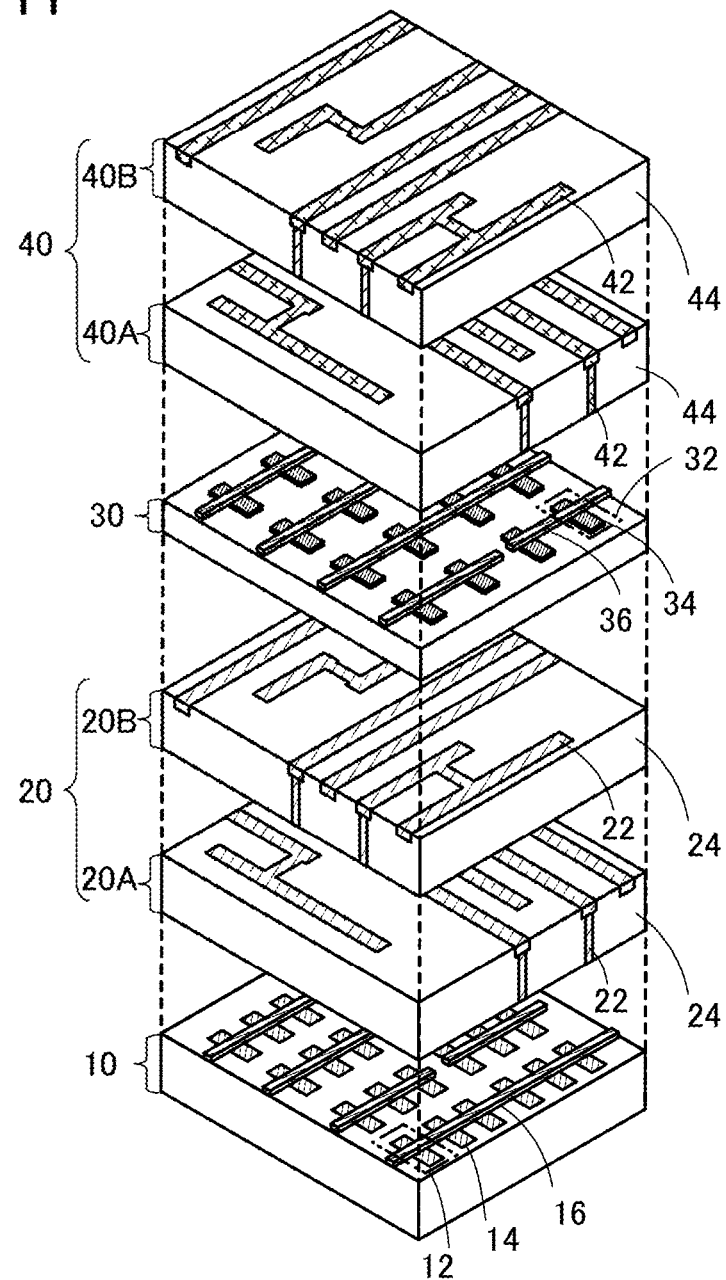
FIG. 11 is a schematic view illustrating a structure example of a semiconductor device.

FIG. 11 is a schematic view of a layer structure of a semiconductor device. A transistor layer 10, a wiring layer 20, a transistor layer 30, and a wiring layer 40 are provided to overlap each other in this order. The wiring layer 20 shown as an example includes a wiring layer 20A and a wiring layer 20B. The wiring layer 40 includes a wiring layer 40A and a wiring layer 40B. In the wiring layer 20 and/or the wiring layer 40, a capacitor can be formed such that an insulator is sandwiched between conductors.

The transistor layer 10 includes a plurality of transistors 12. The transistor 12 includes a semiconductor layer 14 and a gate electrode 16. Although a layer processed into an island shape is shown as the semiconductor layer 14, the semiconductor layer 14 may be a semiconductor layer obtained by isolation from a semiconductor substrate. Although a gate electrode for a top-gate transistor is shown as the gate electrode 16, the gate electrode 16 may be a gate electrode for a bottom-gate, double-gate, or dual-gate transistor, for example.

Each of the wiring layers 20A and 20B includes a wiring 22 that is embedded in an opening provided in an insulating layer 24. The wiring 22 functions as a wiring for connecting elements such as transistors.

The transistor layer 30 includes a plurality of transistors 32. The transistor 32 includes a semiconductor layer 34 and a gate electrode 36. Although a layer processed into an island shape is shown as the semiconductor layer 34, the semiconductor layer 34 may be obtained by isolation from a semiconductor substrate. Although a gate electrode for a top-gate transistor is shown as the gate electrode 36, the gate electrode 36 may be a gate electrode for a bottom-gate, double-gate, or dual-gate transistor, for example.

Each of the wiring layers 40A and 40B includes a wiring 42 that is embedded in an opening provided in an insulating layer 44. The wiring 42 functions as a wiring for connecting elements such as transistors.

The semiconductor layer 14 is formed using a semiconductor material different from that for the semiconductor layer 34. For example, given that the transistor 12 is a Si transistor and the transistor 32 is an OS transistor, the semiconductor material for the semiconductor layer 14 is silicon and that for the semiconductor layer 34 is an oxide semiconductor.

Figure 12A:
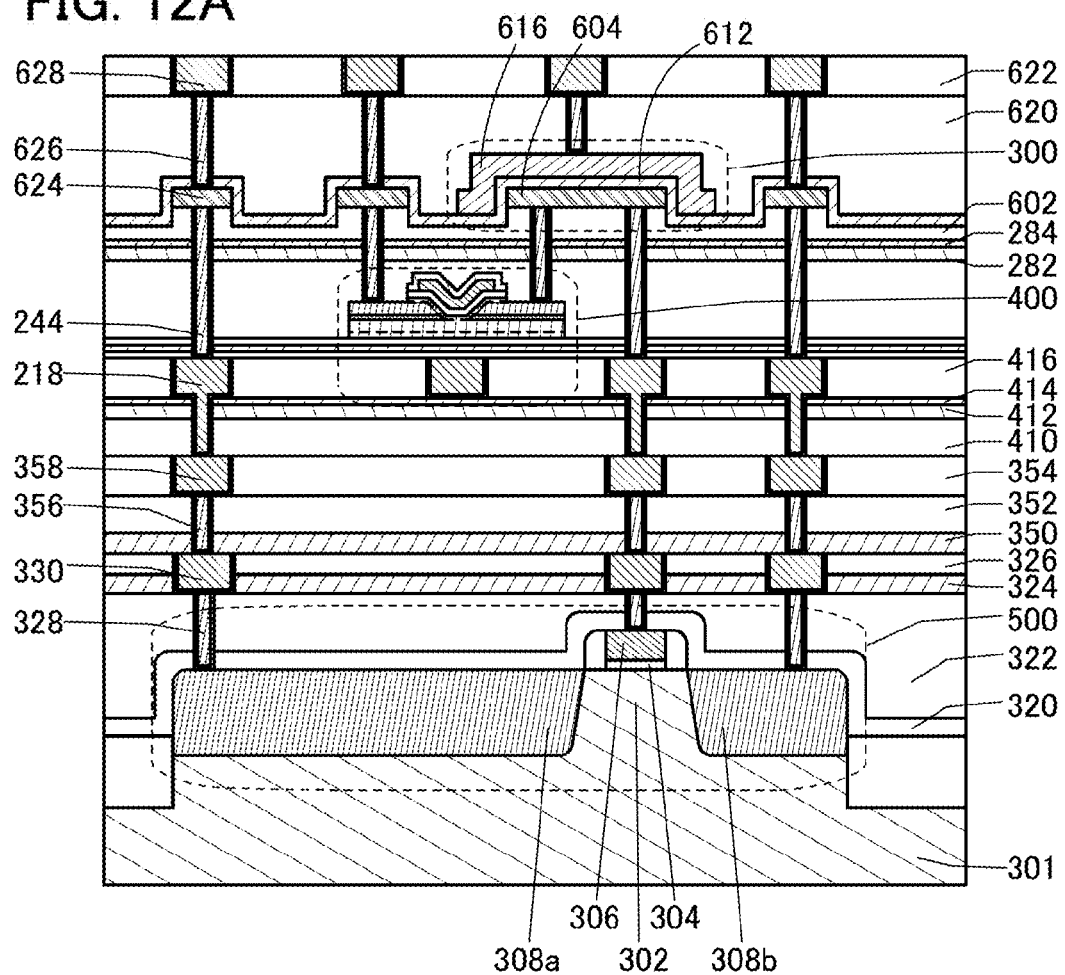
FIGS. 12A and 12B are schematic cross-sectional views illustrating a structure example of a semiconductor device.
Figure 12B:
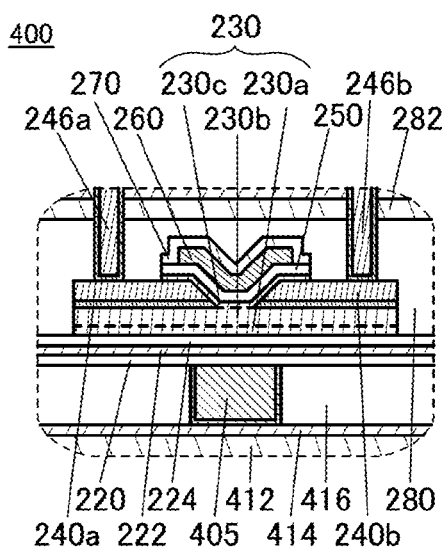
Figure 13A:
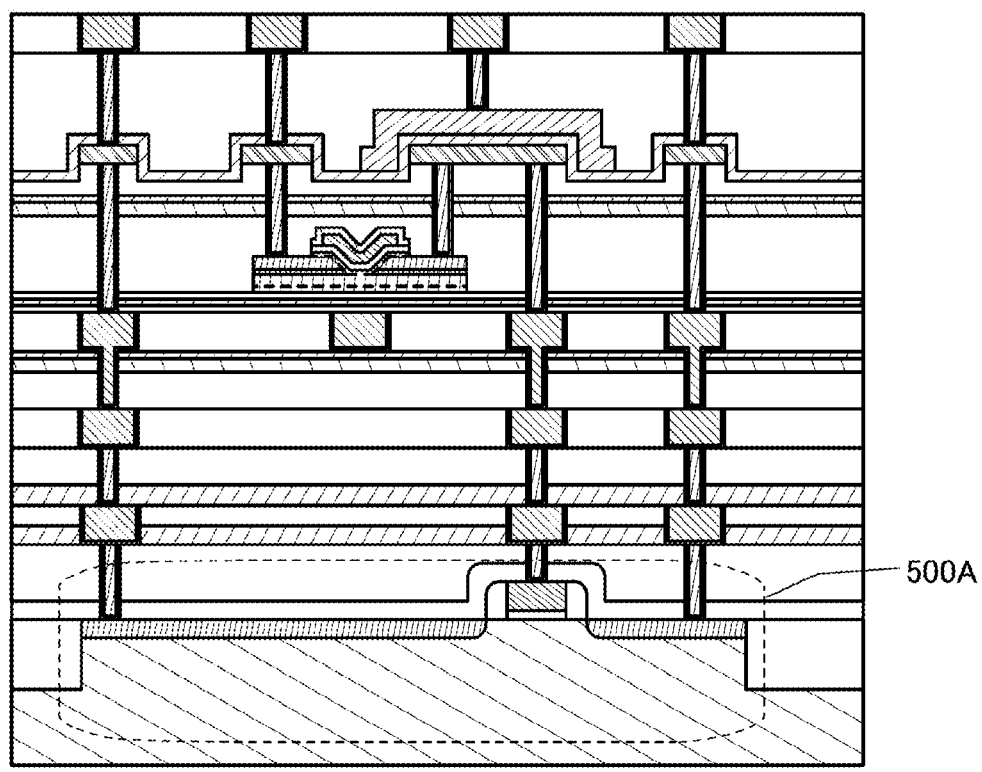
FIGS. 13A and 13B are schematic cross-sectional views each illustrating a structure example of a semiconductor device.
Figure 13B:
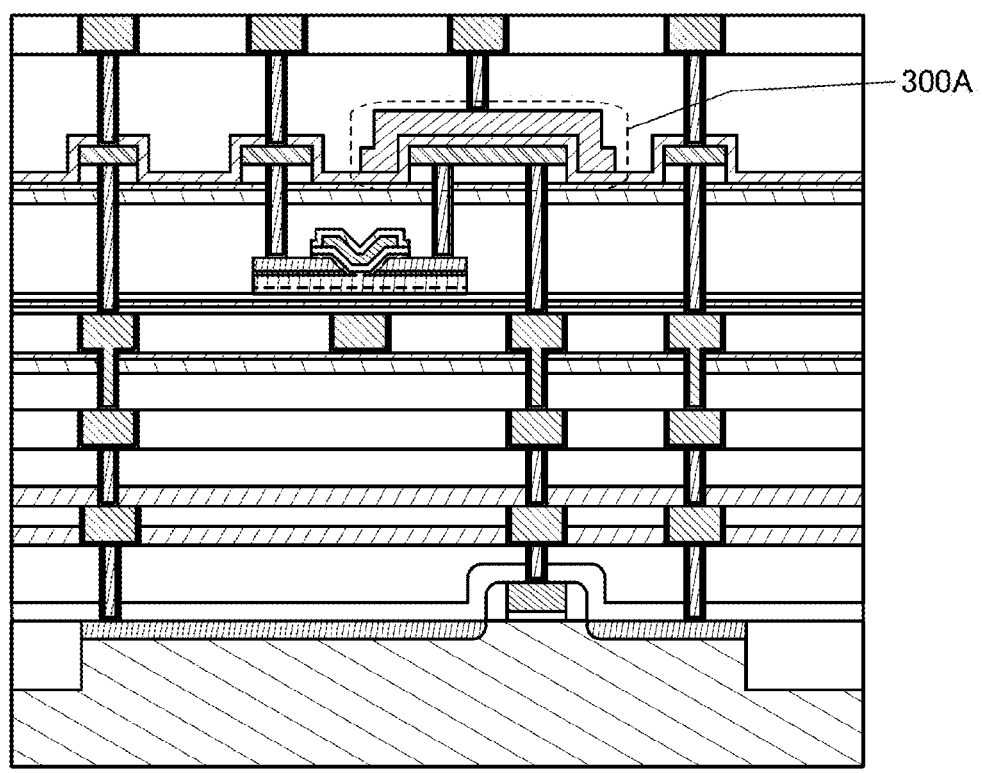

FIG. 12A illustrates an example of a cross-sectional view of a semiconductor device. FIG. 12B is an enlarged view of part of the structure in FIG. 12A.

The semiconductor device illustrated in FIG. 12A includes a capacitor 300, a transistor 400, and a transistor 500.

The capacitor 300 is provided over an insulator 602 and includes a conductor 604, an insulator 612, and a conductor 616.

The conductor 604 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 604 is formed concurrently with another component such as a plug or a wiring, a low-resistance metal material such as copper (Cu) or aluminum (Al) can be used.

The insulator 612 is provided to cover a side surface and a top surface of the conductor 604. The insulator 612 has a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

The conductor 616 is provided to cover the side surface and the top surface of the conductor 604 with the insulator 612 positioned therebetween.

Note that the conductor 616 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. When the conductor 616 is formed concurrently with another component such as a conductor, a low-resistance metal material such as copper (Cu) or aluminum (Al) can be used.

With the structure where the conductor 616 included in the capacitor 300 covers the side surface and the top surface of the conductor 604 with the insulator 612 positioned therebetween, the capacitance per projected area of the capacitor 300 can be increased. Thus, the semiconductor device can be reduced in area, highly integrated, and miniaturized.

The transistor 500 is provided over a substrate 301 and includes a conductor 306, an insulator 304, a semiconductor region 302 that is part of the substrate 301, and low-resistance regions 308a and 308b functioning as a source region and a drain region.

The transistor 500 is either a p-channel transistor or an n-channel transistor.

A channel formation region of the semiconductor region 302, a region around the channel formation region, the low-resistance regions 308a and 308b functioning as a source region and a drain region, and the like contain preferably a semiconductor such as a silicon-based semiconductor, more preferably single crystal silicon. Alternatively, they may contain a material containing germanium (Ge), silicon germanium (SiGe), gallium arsenide (GaAs), gallium aluminum arsenide (GaAlAs), or the like. They may contain silicon whose effective mass is controlled by applying stress to the crystal lattice and thereby changing the lattice spacing. Alternatively, the transistor 500 may be a high-electron-mobility transistor (HEMT) using GaAs and GaAlAs, or the like.

The low-resistance regions 308a and 308b contain an element that imparts n-type conductivity (e.g., arsenic or phosphorus) or an element that imparts p-type conductivity (e.g., boron) in addition to a semiconductor material used for the semiconductor region 302.

The conductor 306 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the threshold voltage of the transistor 500 can be adjusted by setting the work function of the gate electrode with a material of the conductor 306. Specifically, it is preferable to use titanium nitride, tantalum nitride, or the like as the conductor 306. Furthermore, in order to ensure the conductivity and embeddability of the conductor, it is preferable to use a laminated layer of metal materials such as tungsten and aluminum as the conductor 306. In particular, tungsten is preferable in terms of heat resistance.

In the transistor 500 illustrated in FIG. 12A, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting a work function. The transistor 500 with such a structure is also referred to as FIN transistor because it utilizes a protruding portion of the semiconductor substrate. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 500 illustrated in FIG. 12A is just an example; without limitation to the structure shown in FIG. 12A, an appropriate transistor can be used in accordance with a circuit structure or a driving method. For example, a planar transistor 500A illustrated in FIG. 13A may be used.

An insulator 320, an insulator 322, an insulator 324, and an insulator 326 are sequentially stacked and cover the transistor 500.

The insulator 322 functions as a planarization film for eliminating a level difference caused by the transistor 500 or the like underlying the insulator 322. A top surface of the insulator 322 may be planarized by planarization treatment using a chemical mechanical polishing (CMP) method or the like to increase the level of planarity.

The insulator 324 functions as a barrier film that prevents hydrogen or impurities from diffusing from the substrate 301, the transistor 500, or the like into a region where the transistor 400 is formed. For example, the insulator 324 can be formed using nitride such as silicon nitride.

A conductor 328, a conductor 330, and the like that are electrically connected to the capacitor 300 or the transistor 400 are embedded in the insulator 320, the insulator 322, the insulator 324, and the insulator 326. The conductor 328 and the conductor 330 each function as a plug or a wiring. Note that a plurality of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and where part of a conductor functions as a plug.

For each of the plugs and wirings (e.g., the conductor 328 and the conductor 330), a single-layer structure or a stacked-layer structure using a conductive material such as a metal material, an alloy material, or a metal oxide material can be used. It is preferable to use a high-melting-point material that has both heat resistance and conductivity, such as tungsten or molybdenum, and it is particularly preferable to use tungsten. It is particularly preferable to use a low-resistance conductive material such as aluminum or copper. The use of the above material can reduce the wiring resistance.

A wiring layer may be provided over the insulator 326 and the conductor 330. For example, an insulator 350, an insulator 352, and an insulator 354 are sequentially stacked in FIG. 12A. A conductor 356 and a conductor 358 are embedded in the insulator 350, the insulator 352, and the insulator 354. The conductor 356 and the conductor 358 each function as a plug or a wiring.

Note that for example, the insulator 350 is preferably formed using an insulator with a barrier property against hydrogen, like the insulator 324. The conductor 356 and the conductor 358 are preferably formed using a conductor with a barrier property against hydrogen. The conductor with a barrier property against hydrogen is formed in an opening in the insulator 350 with a barrier property against hydrogen. This structure can separate the transistor 500 and the transistor 400 by the barrier layer, and thus can prevent diffusion of hydrogen from the transistor 500 to the transistor 400.

As a conductor with a barrier property against hydrogen, tantalum nitride can be used, for example. Stacking tantalum nitride and tungsten, which has high conductivity, can prevent diffusion of hydrogen from the transistor 500 while the conductivity of a wiring is ensured.

The transistor 400 is provided over the insulator 354. FIG. 12B is an enlarged view of the transistor 400. Note that the transistor 400 illustrated in FIG. 12B is just an example; without limitation to the structure shown in FIG. 12B, an appropriate transistor can be used in accordance with a circuit structure or a driving method.

The transistor 400 is a transistor in which a channel is formed in a semiconductor layer containing an oxide semiconductor. The off-state current of the transistor 400 is small; thus, using the transistor 400 in a frame memory of a semiconductor device enables stored data to be retained for a long time.

An insulator 410, an insulator 412, an insulator 414, and an insulator 416 are sequentially stacked over the insulator 354. A conductor 218, a conductor 405, and the like are embedded in the insulator 410, the insulator 412, the insulator 414, and the insulator 416. The conductor 218 functions as a plug or a wiring that is electrically connected to the capacitor 300 or the transistor 500. The conductor 405 functions as a gate electrode of the transistor 400.

A material with a barrier property against oxygen or hydrogen is preferably used for any of the insulators 410, 412, 414, and 416. In particular, in the case of using an oxide semiconductor in the transistor 400, the reliability of the transistor 400 can be increased when an insulator including an oxygen excess region is provided as an interlayer film or the like around the transistor 400. Accordingly, in order to diffuse oxygen from the interlayer film around the transistor 400 to the transistor 400 efficiently, layers with barrier properties against hydrogen and oxygen are preferably provided such that the transistor 400 and the interlayer film are sandwiched therebetween.

For example, aluminum oxide, hafnium oxide, or tantalum oxide is preferably used for the barrier layers. Stacking the barrier layers achieves the function of diffusing oxygen more reliably.

An insulator 220, an insulator 222, and an insulator 224 are sequentially stacked over the insulator 416. Part of a conductor 244 is embedded in the insulator 220, the insulator 222, and the insulator 224.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). When such an insulator containing excess oxygen is provided in contact with an oxide 230 in which a channel region of the transistor 400 is formed, oxygen vacancies in the oxide can be filled. Note that the insulators 220 and 224 are not necessarily formed of the same material.

The insulator 222 preferably has a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and ($Ba,Sr$)$TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material and may be formed of different materials.

When the insulator 222 containing a high-k material is provided between the insulator 220 and the insulator 224, electrons can be trapped in the insulator 222 under specific conditions, resulting in a higher threshold voltage. In other words, the insulator 222 is negatively charged in some cases.

For example, when the insulator 220 and the insulator 224 are formed using silicon oxide and the insulator 222 is formed using a material having a lot of electron trap states (e.g., hafnium oxide, aluminum oxide, or tantalum oxide), electrons move from the oxide 230 toward the conductor 405 under the following conditions: the potential of the conductor 405 is kept higher than the potential of a source electrode and a drain electrode for 10 milliseconds or longer, typically 1 minute or longer at temperatures higher than the operating temperature or the storage temperature of the semiconductor device (e.g., at temperatures ranging from 125° C. to 450° C., typically from 150° C. to 300° C.). At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 405, the amount of electrons to be trapped can be controlled, and the threshold voltage can be controlled accordingly. The transistor 400 having this structure is a normally-off transistor, which is in a non-conduction state (also referred to as off state) even when the gate voltage is 0 V.

The treatment for trapping the electrons can be performed in the manufacturing process of the transistor. For example, the treatment can be performed at any step before factory shipment, such as after the formation of a conductor connected to a source electrode or a drain electrode of the transistor, after the wafer process, after a wafer-dicing step, or after packaging.

The insulator 222 is preferably formed using a material with a barrier property against oxygen or hydrogen. The use of such a material can prevent release of oxygen from the oxide 230 and entry of impurities such as hydrogen from the outside.

An oxide 230a, an oxide 230b, and an oxide 230c are formed using a metal oxide such as an In—M—Zn oxide (M is Al, Ga, Y, or Sn). An In—Ga oxide or an In—Zn oxide may be used as the oxide 230a, the oxide 230b, and the oxide 230c. Hereinafter the oxide 230a, the oxide 230b, and the oxide 230c may be collectively referred to as the oxide 230.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

One of a conductor 240a and a conductor 240b functions as a source electrode, and the other functions as a drain electrode.

The conductor 240a and the conductor 240b are formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, the conductor 240a and the conductor 240b can have any of the following structures: a single-layer structure of an aluminum film containing silicon, a two-layer structure in which an aluminum film is stacked over a tantalum film or a tantalum nitride film, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

An insulator 250 can have a single-layer structure or a stacked-layer structure using one or more of insulators such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Like the insulator 224, the insulator 250 is preferably an oxide insulator that contains oxygen in excess of that in the stoichiometric composition.

Note that the insulator 250 may have a stacked-layer structure similar to that of the insulator 220, the insulator 222, and the insulator 224. When the insulator 250 contains an insulator in which a necessary amount of electrons is trapped by electron trap states, the threshold voltage of the transistor 400 can be shifted in the positive direction. The transistor 400 having this structure is a normally-off transistor, which is in a non-conduction state (off state) even when the gate voltage is 0 V.

A conductor 260 functioning as a gate electrode can be formed using a metal selected from aluminum, chromium, copper, tantalum, titanium, molybdenum, and tungsten, an alloy containing any of these metals as its component, or an alloy containing any of these metals in combination, for example. Furthermore, one or both of manganese and zirconium may be used. A semiconductor typified by polycrystalline silicon doped with an impurity element such as phosphorus, or a silicide such as nickel silicide may be used. For example, the conductor 260 can have any of the following structures: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order. Alternatively, an alloy film or a nitride film that contains aluminum and one or more metals selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure using the above light-transmitting conductive material and the above metal.

An insulator 280 is preferably formed using an oxide material from which oxygen is partly released due to heating.

As the oxide material from which oxygen is released due to heating, an oxide containing oxygen in excess of that in the stoichiometric composition is preferably used. Part of oxygen is released due to heating from an oxide film containing oxygen in excess of that in the stoichiometric composition. The oxide film containing oxygen in excess of that in the stoichiometric composition is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the temperature of the film surface in the TDS analysis preferably ranges from 100° C. to 700° C. or from 100° C. to 500° C.

As such a material, a material containing silicon oxide or silicon oxynitride is preferably used, for example. Alternatively, a metal oxide can be used. Note that in this specification, silicon oxynitride refers to a material that has a higher oxygen content than a nitrogen content, and silicon nitride oxide refers to a material that has a higher nitrogen content than an oxygen content.

The insulator 280 covering the transistor 400 may function as a planarization film that covers roughness thereunder.

An insulator 270 may be provided to cover the conductor 260. When the insulator 280 is formed using an oxide material from which oxygen is released, the insulator 270 is formed using a material with a barrier property against oxygen to prevent the conductor 260 from being oxidized by the released oxygen. With this structure, oxidation of the conductor 260 can be prevented, and oxygen released from the insulator 280 can be efficiently supplied to the oxide 230.

An insulator 282 and an insulator 284 are sequentially stacked over the insulator 280. The conductor 244, a conductor 246a, a conductor 246b, and the like are embedded in the insulator 280, the insulator 282, and the insulator 284. The conductor 244 functions as a plug or a wiring that is electrically connected to the capacitor 300 or the transistor 500. Each of the conductors 246a and 246b functions as a plug or a wiring that is electrically connected to the capacitor 300 or the transistor 400.

A material with a barrier property against oxygen or hydrogen is preferably used for one or both of the insulator 282 and the insulator 284. Accordingly, oxygen released from the interlayer film around the transistor 400 can be efficiently diffused into the transistor 400.

The capacitor 300 is provided above the insulator 284.

The conductor 604 and a conductor 624 are provided over the insulator 602. The conductor 624 functions as a plug or a wiring that is electrically connected to the transistor 400 or the transistor 500.

The insulator 612 is provided over the conductor 604, and the conductor 616 is provided over the insulator 612. The conductor 616 covers a side surface of the conductor 604 with the insulator 612 placed therebetween. That is, a capacitance is formed also on the side surface of the conductor 604, so that the capacitance per projected area of the capacitor can be increased. Thus, the semiconductor device can be reduced in area, highly integrated, and miniaturized.

Note that the insulator 602 is provided at least in a region overlapped by the conductor 604. For example, as in a capacitor 300A illustrated in FIG. 13B, the insulator 602 may be provided only in regions overlapped by the conductor 604 or the conductor 624 so that the insulator 602 is in contact with the insulator 612.

An insulator 620 and an insulator 622 are sequentially stacked over the conductor 616. A conductor 626 and a conductor 628 are embedded in the insulator 620, the insulator 622, and the insulator 602. Each of the conductor 626 and the conductor 628 functions as a plug or a wiring that is electrically connected to the transistor 400 or the transistor 500.

The insulator 620 covering the capacitor 300 may function as a planarization film that covers roughness thereunder.

The above is the example of the stacked structure of the transistors in the semiconductor device.

<Display System>

Figure 14:
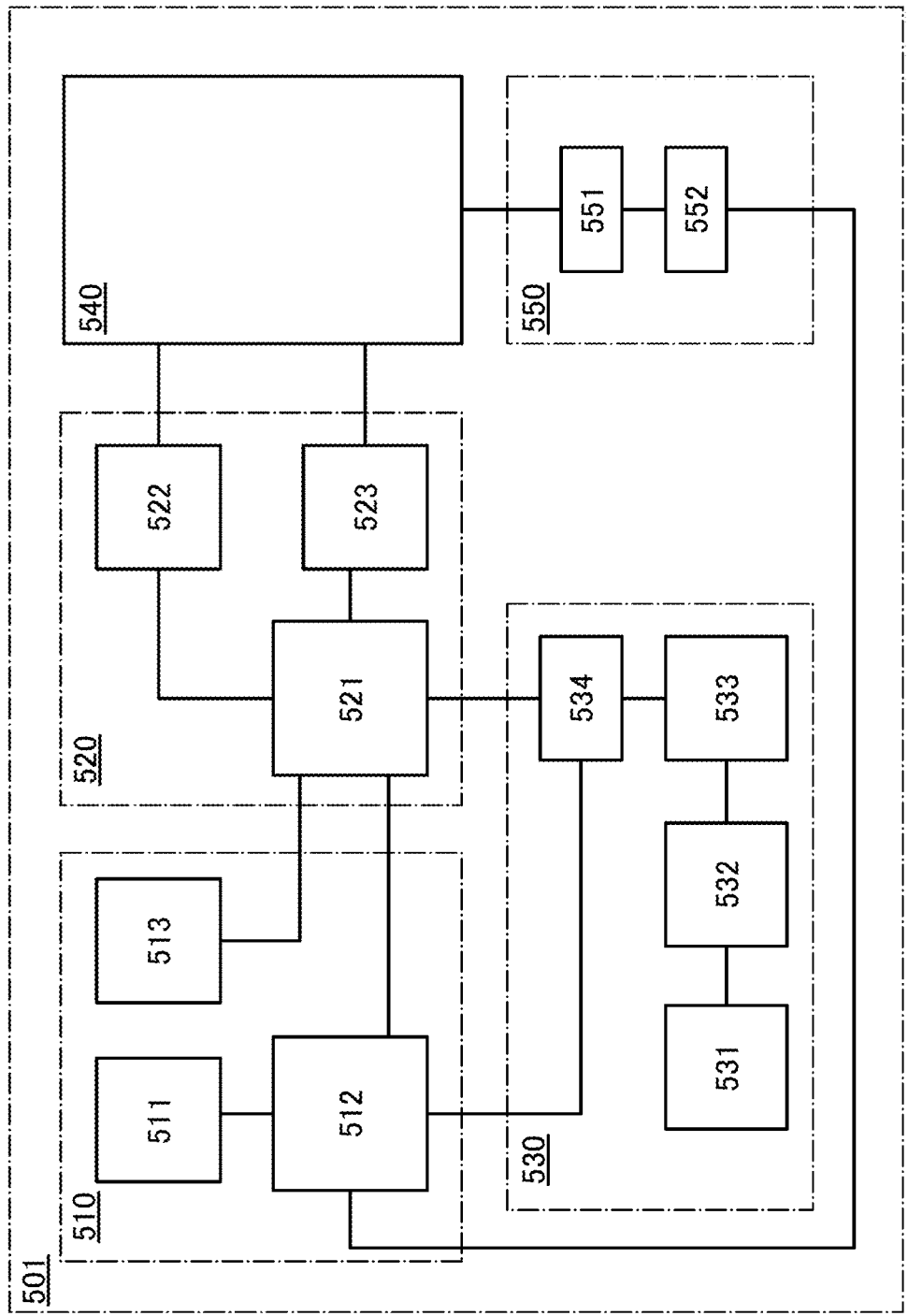
FIG. 14 is a block diagram illustrating a display system.

FIG. 14 is a block diagram illustrating a structure example of a display system including the above semiconductor device.

A display system 501 includes a video data communication portion 510, a display driver portion 520, a power source control portion 530, a display device portion 540, and a touch panel portion 550.

The video data communication portion 510 includes a wireless signal reception portion 511, a processor 512, and a video data input portion 513. The wireless signal reception portion 511 has a function of being connected to a wireless local area network (LAN) to receive video data or the like. The processor 512 decodes video data or the like received in the wireless signal reception portion 511 and outputs the decoded video data or the like to the display driver portion 520. The video data input portion 513 corresponds to an input terminal when video data is directly input from the outside. Video data input to the video data input portion 513 is output to the display driver portion 520.

The display driver portion 520 includes a PLD 521, a display controller 522, and a power supply circuit 523. The PLD 521 can have any of the structures of the semiconductor devices described in the above. Accordingly, by switching contexts, signal processing of video data with different formats can be performed, and power consumption at the context switch can be reduced. The display controller 522 generates a video signal and a control signal for driving the display device portion 540 on the basis of video data processed in the PLD 521 and outputs the video signal and the control signal to the display device portion 540. The power supply circuit 523 generates power supply voltage for driving the display device portion 540 on the basis of video data processed in the PLD 521 and outputs the power supply voltage to the display device portion 540.

The power source control portion 530 includes a wireless power supply module 531, a secondary battery 532, a voltage conversion circuit 533, and a power source controller 534. Power is wirelessly supplied to the wireless power supply module 531 under a wireless power supply standard. The secondary battery 532 is charged with power obtained by supply of power to the wireless power supply module 531. The voltage conversion circuit 533 converts voltage generated by discharge of the secondary battery 532 and outputs the converted voltage to the power source controller 534. The power source controller 534 controls output of power used for each circuit of the display system 501.

The display device portion 540 includes, in addition to a display region including a plurality of pixels, driver circuits such as a scan line driver circuit and a signal line driver circuit that control writing of a video signal to each pixel. Structure examples of the display device portion 540 are described in detail with reference to FIGS. 15A to 15C and FIGS. 16A and 16B.

The touch panel portion 550 includes a detection circuit 551 and an arithmetic circuit 552. The detection circuit 551 outputs an electrical signal obtained by detection of an object to be detected to the arithmetic circuit 552. The arithmetic circuit 552 performs arithmetic operation for identifying the position of an object to be detected on the basis of an electrical signal obtained by the detection circuit 551 and outputs an arithmetic operation result to the processor 512.

<Display Device Portion>

Figure 15A:
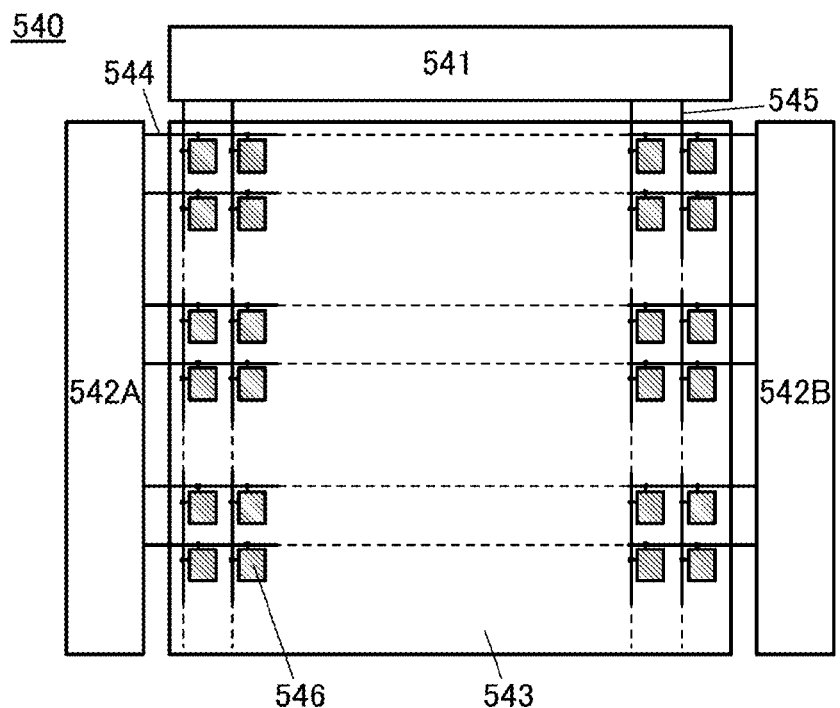
FIG. 15A is a block diagram illustrating a display device portion.

FIG. 15A is a block diagram illustrating a structure example of the display device portion 540.

The display device portion 540 in FIG. 15A includes driver circuits 541, 542A, and 542B, and a display region 543. Note that the driver circuits 541, 542A, and 542B are collectively referred to as a driver circuit or a peripheral driver circuit in some cases.

The driver circuits 542A and 542B can function as, for example, scan line driver circuits. The driver circuit 541 can function as, for example, a signal line driver circuit. Note that one of the driver circuits 542A and 542B may be omitted. Alternatively, some sort of circuit facing the driver circuit 541 with the display region 543 positioned therebetween may be provided.

The display device portion 540 illustrated in FIG. 15A includes p wirings 544 that are arranged substantially parallel to each other and whose potentials are controlled by the driver circuit 542A and/or the driver circuit 542B, and q wirings 545 that are arranged substantially parallel to each other and whose potentials are controlled by the driver circuit 541 (p and q are each a natural number of larger than or equal to 1). The display region 543 includes a plurality of pixels 546 arranged in a matrix. The pixel 546 includes a pixel circuit and a display element.

When every three pixels 546 function as one pixel, full-color display can be achieved. The three pixels 546 control the transmittance, reflectance, amount of emitted light, or the like of red light, green light, or blue light. The light colors controlled by the three pixels 546 are not limited to the combination of red, green, and blue, and may be yellow, cyan, and magenta.

A pixel 546 that controls white light may be added to the pixels that control red light, green light, and blue light so that the four pixels 546 collectively function as one pixel. The addition of the pixel 546 that controls white light can increase the luminance of the display region. When the number of pixels 546 functioning as one pixel is increased to use red, green, blue, yellow, cyan, and magenta in appropriate combination, the range of color reproduction can be widened.

For example, using pixels arranged in a matrix of 1920× 1080, the display device portion 540 that can display an image with "full high definition" (also referred to as "2K resolution," "2K1K," "2K," and the like) can be obtained. Using pixels arranged in a matrix of 3840×2160, the display device portion 540 that can display an image with "ultra-high definition" (also referred to as "4K resolution," "4K2K," "4K," and the like) can be obtained. Using pixels arranged in a matrix of 7680×4320, the display device portion 540 that can display an image with "super high definition" (also referred to as "8K resolution," "8K4K," "8K," and the like) can be obtained. Using a larger number of pixels, the display device portion 540 that can display an image with 16K or 32K resolution can be obtained.

A wiring 544_g in a g-th row (g is a natural number of larger than or equal to 1 and smaller than or equal to p) is electrically connected to q pixels 546 in the g-th row among the plurality of pixels 546 arranged in p rows and q columns in the display region 543. A wiring 545_h in an h-th column (h is a natural number of larger than or equal to 1 and smaller than or equal to q) is electrically connected to p pixels 546 in the h-th column among the plurality of pixels 546 arranged in p rows and q columns.

[Display Element]

The display device portion 540 can employ various modes and include various display elements. Examples of the display element include a display element including a display medium whose contrast, luminance, reflectance, transmittance, or the like is changed by electrical or magnetic action, such as an electroluminescence (EL) element (e.g., an organic EL element, an inorganic EL element, or an EL element including organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Examples of display devices using EL elements include an EL display. Examples of display devices including electron emitters include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, electronic liquid powder (registered trademark), or electrophoretic elements include electronic paper. The display device may be a plasma display panel (PDP). The display device may be a retina scanning-type projection device.

In the case of a transflective liquid crystal display or a reflective liquid crystal display, some or all of pixel electrodes function as reflective electrodes. For example, some or all of pixel electrodes contain aluminum, silver, or the like. In such a case, a memory circuit such as an SRAM can be provided below the reflective electrodes. Thus, power consumption can be further reduced.

Note that in the case of using an LED, graphene or graphite may be provided below an electrode or a nitride semiconductor of the LED. Graphene or graphite may be a multilayer film in which a plurality of layers are stacked. Providing graphene or graphite in such a manner enables easy formation of a nitride semiconductor film thereover, such as an n-type GaN semiconductor layer including crystals. Furthermore, a p-type GaN semiconductor layer including crystals, or the like, can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when graphene is provided, the GaN semiconductor layers included in the LED can also be formed by sputtering.

[Example of Pixel Including Light-Emitting Element]

Figure 15B:
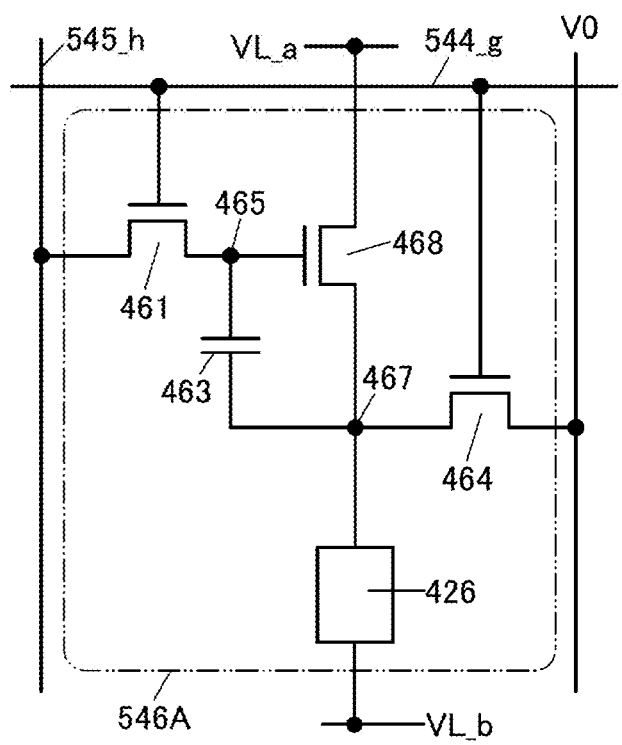
FIGS. 15B and 15C are circuit diagrams each illustrating a pixel example.

A pixel 546A in FIG. 15B includes a transistor 461, a capacitor 463, a transistor 468, a transistor 464, and a light-emitting element 426 that can function as a display element.

One of a source electrode and a drain electrode of the transistor 461 is electrically connected to the wiring 545_h. A gate electrode of the transistor 461 is electrically connected to the wiring 544_g. The wiring 545_h supplies a video signal.

The transistor 461 has a function of controlling writing of a video signal to a node 465.

One of a pair of electrodes of the capacitor 463 is electrically connected to the node 465, and the other of the pair of electrodes of the capacitor 463 is electrically connected to a node 467. The other of the source electrode and the drain electrode of the transistor 461 is electrically connected to the node 465.

The capacitor 463 functions as a storage capacitor for retaining data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a wiring V0, and the other of the source electrode and the drain electrode of the transistor 464 is electrically connected to the node 467. A gate electrode of the transistor 464 is electrically connected to the wiring 544_g.

One of an anode and a cathode of the light-emitting element 426 is electrically connected to a potential supply line VL_b, and the other of the anode and the cathode of the light-emitting element 426 is electrically connected to the node 467.

As the light-emitting element 426, an organic electroluminescence element (also referred to as an organic EL element) or the like can be used, for example. Note that the light-emitting element 426 is not limited thereto and may be an inorganic EL element containing an inorganic material, for example.

A high power supply potential VDD is applied to one of the potential supply line VL_a and the potential supply line VL_b, and a low power supply potential VSS is applied to the other of the potential supply line VL_a and the potential supply line VL_b, for example.

In the display device portion 540 including the pixels 546A in FIG. 15B, the pixels 546A are sequentially selected row by row by the driver circuit 542A and/or the driver circuit 542B, so that the transistors 461 are turned on and a video signal is written to the nodes 465.

The pixel 546A in which data is written to the node 465 is brought into a retention state when the transistors 461 and 464 are turned off. The amount of current flowing between the source electrode and the drain electrode of the transistor 468 is controlled in accordance with the potential of the data written to the node 465. The light-emitting element 426 emits light with luminance corresponding to the amount of flowing current. This operation is sequentially performed row by row; thus, an image can be displayed.

The transistors 461, 464, and 468 may be transistors with back gates. In that case, in each of the transistors 461, 464, and 468, the gate may be electrically connected to the back gate.

[Example of Pixel Including Liquid Crystal Element]

Figure 15C:
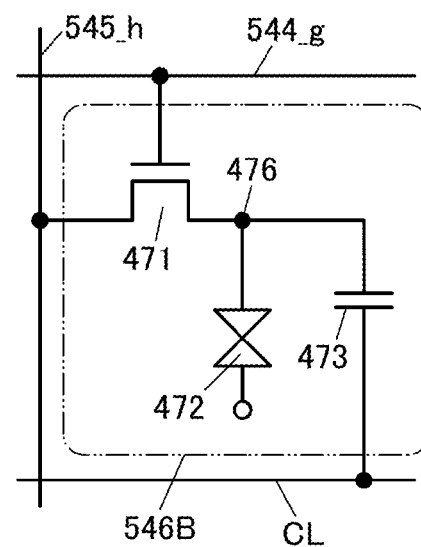

A pixel 546B in FIG. 15C includes a transistor 471, a capacitor 473, and a liquid crystal element 472.

The potential of one of a pair of electrodes of the liquid crystal element 472 is set as appropriate according to the specifications of the pixel 546B. For example, one of the pair of electrodes of the liquid crystal element 472 may be supplied with a common potential, or may have the same potential as a capacitor line CL. Furthermore, the potential applied to one of the pair of electrodes of the liquid crystal element 472 may be different among the pixels 546B. The other of the pair of electrodes of the liquid crystal element 472 is electrically connected to a node 476. The alignment state of the liquid crystal element 472 depends on data written to the node 476.

As a method for driving the display device including the liquid crystal element 472, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferro electric liquid crystal (AFLC) mode, a multi-domain vertical alignment (MVA) mode, a patterned vertical alignment (PVA) mode, an in-plane switching (IPS) mode, a fringe field switching (FFS) mode, a transverse bend alignment (TBA) mode, and the like. Other examples of the method for driving the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like, depending on conditions.

Alternatively, a liquid crystal exhibiting a blue phase for which an alignment film is unnecessary may be used. A blue phase is one of liquid crystal phases, which is generated immediately before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 ms or less, and has optical isotropy, which makes alignment process unnecessary and viewing angle dependence small. An alignment film does not need to be provided and rubbing treatment is thus not necessary; accordingly, electrostatic discharge caused by the rubbing treatment can be prevented and defects and damage of the liquid crystal display device in manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions.

The specific resistance of the liquid crystal material is greater than or equal to $1\times10^9$ Ω·cm, preferably greater than or equal to $1\times10^{11}$ Ω·cm, further preferably greater than or equal to $1\times10^{12}$ Ω·cm. Note that the specific resistance in this specification is measured at 20° C.

In the pixel 546B in the g-th row and the h-th column, one of a source electrode and a drain electrode of the transistor 471 is electrically connected to the wiring 545_h, and the other of the source electrode and the drain electrode of the transistor 471 is electrically connected to the node 476. A gate electrode of the transistor 471 is electrically connected to the wiring 544_g. The wiring 545_h supplies a video signal. The transistor 471 has a function of controlling writing of a video signal to the node 476.

One of a pair of electrodes of the capacitor 473 is electrically connected to a wiring to which a particular potential is supplied (hereinafter referred to as the capacitor line CL), and the other of the pair of electrodes of the capacitor 473 is electrically connected to the node 476. The potential of the capacitor line CL is set as appropriate according to the specifications of the pixel 546B. The capacitor 473 functions as a storage capacitor for retaining data written to the node 476.

For example, in the display device portion 540 including the pixels 546B in FIG. 15C, the pixels 546B are sequentially selected row by row by the driver circuit 542A and/or the driver circuit 542B, so that the transistors 471 are turned on and a video signal is written to the nodes 476.

The pixel 546B in which the video signal is written to the node 476 is brought into a retention state when the transistor 471 is turned off. This operation is sequentially performed row by row; thus, an image can be displayed on the display region 543.

The transistor 471 may be a transistor with a back gate. In that case, the gate of the transistor 471 may be electrically connected to the back gate.

[Example of Pixel Including Liquid Crystal Element and Light-Emitting Element]

Figure 16A:
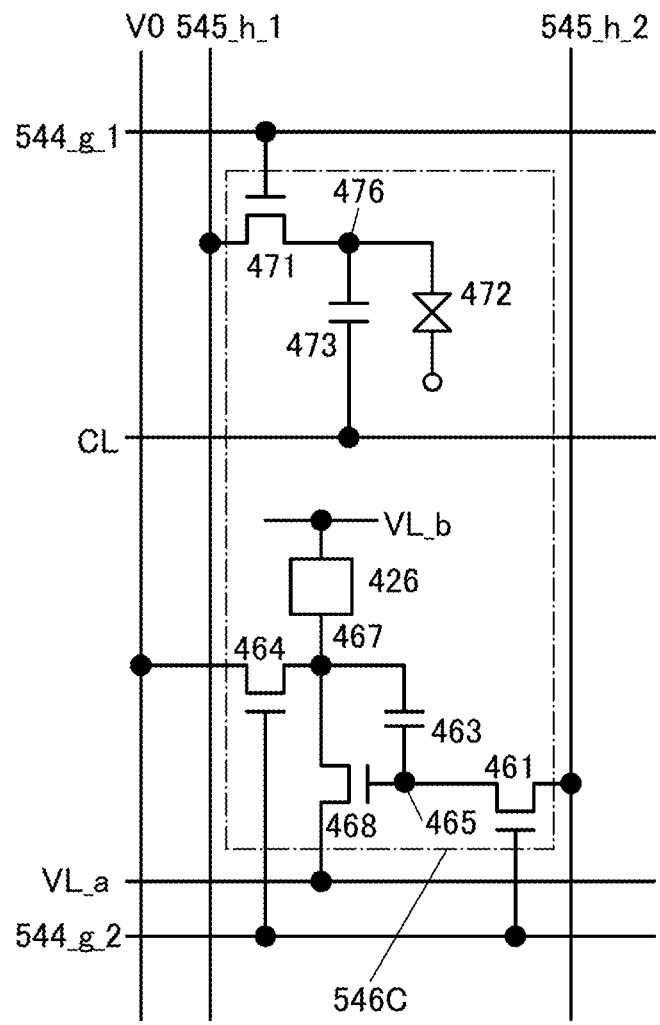
FIG. 16A is a circuit diagram illustrating a pixel example.

A pixel 546C in FIG. 16A includes the transistor 461, the capacitor 463, the transistor 468, the transistor 464, the light-emitting element 426, the transistor 471, the capacitor 473, and the liquid crystal element 472.

The pixel 546C in FIG. 16A has the structure of the pixel 546A in FIG. 15B and the structure of the pixel 546B in FIG. 15C. A video signal supplied to the node 476 is supplied to a wiring 545_h_1. The video signal of the wiring 545_h_1 is written through the transistor 471 whose gate is electrically connected to a wiring 544_g_1. A video signal supplied to the node 465 is supplied to a wiring 545_h_2. The video signal of the wiring 545_h_2 is written through the transistor 461 whose gate is electrically connected to a wiring 544_g_2. Description of driving of the light-emitting element 426 and the liquid crystal element 472 in the pixel 546C in FIG. 16A is similar to description of the pixel 546A in FIG. 15B and description of the pixel 546B in FIG. 15C, and the above descriptions can be referred to.

Figure 16B:
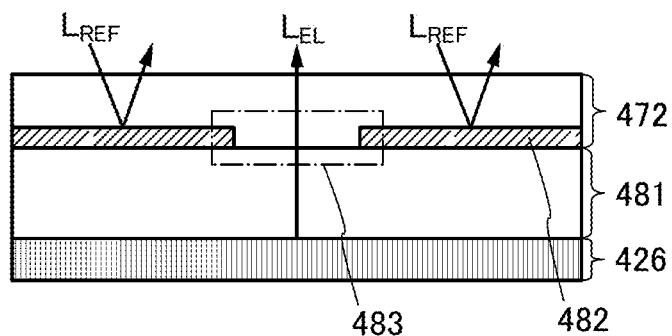
FIG. 16B is a schematic cross-sectional view illustrating the pixel example.

In the display device portion 540 including the pixel 546C in FIG. 16A, the light-emitting element 426 can overlap with the liquid crystal element 472 as illustrated in a cross-sectional schematic view in FIG. 16B. In FIG. 16B, a layer 481 including transistors is provided between the light-emitting element 426 and the liquid crystal element 472. The layer 481 including transistors includes the transistor 461, the capacitor 463, the transistor 468, the transistor 464, the transistor 471, and the capacitor 473. The liquid crystal element 472 in FIG. 16B includes an electrode 482 that can reflect external light ($L_{REF}$). The electrode 482 includes an opening 483 for transmitting light ($L_{EL}$) from the light-emitting element.

In the pixel 546C in FIG. 16A, the light-emitting element 426 and the liquid crystal element 472 can be separately driven. In other words, the light-emitting element 426 and the liquid crystal element 472 in FIG. 16B can be separately driven. Therefore, the display device portion 540 including the pixel 546C in FIG. 16A can switch driving of the light-emitting element 426 and the liquid crystal element 472 depending on illuminance. For example, when illuminance is high, the liquid crystal element 472 is driven to obtain a desired grayscale. When illuminance is low, the light-emitting element 426 is driven to obtain a desired grayscale. With such a structure, it is possible to obtain a display device portion with low power consumption and high visibility.

<Electronic Component>

An electronic component including the above-described semiconductor device is described.

Figure 17A:
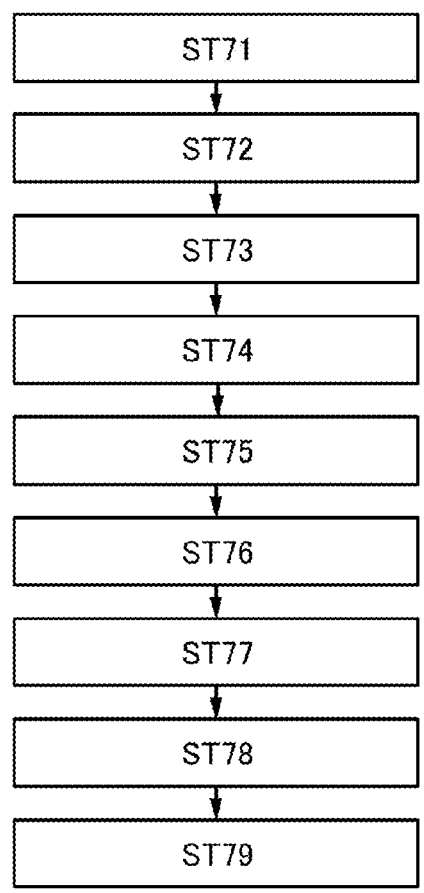
FIG. 17A is a flow chart showing an example of a method for manufacturing an electronic component.

FIG. 17A is a flow chart showing an example of a method for manufacturing an electronic component. The electronic component is also referred to as a semiconductor package or an IC package. This electronic component has a plurality of standards and names depending on a terminal extraction direction and a terminal shape. Therefore, an example of the electronic component is described.

A semiconductor device including a transistor is completed by integrating detachable components on a printed wiring board through an assembly process (post-process). The post-process can be finished through steps in FIG. 17A. Specifically, after an element substrate obtained in a wafer process is completed (step ST71), a rear surface of the substrate is ground. The substrate is thinned in this step to reduce warpage or the like of the substrate in the wafer process and to reduce the size of the electronic component. Next, the substrate is divided into a plurality of chips in a dicing step (step ST72).

Figure 17B:
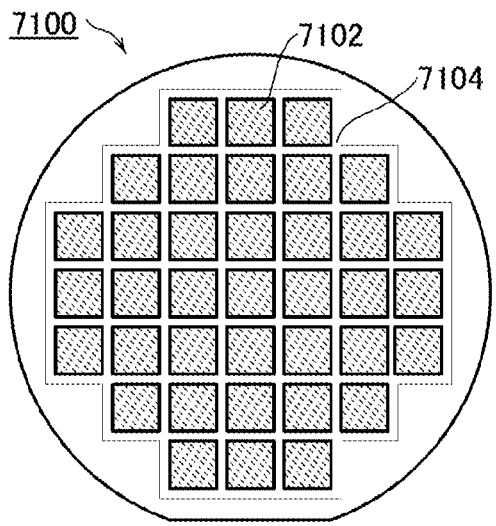
FIG. 17B is a top view of the electronic component.
Figure 17C:
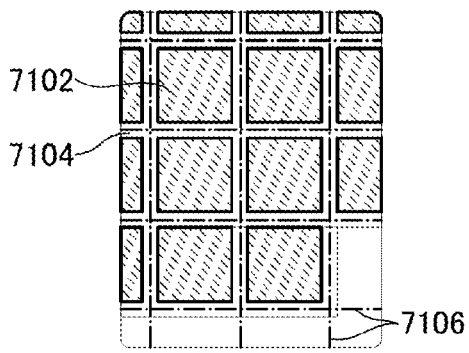
FIG. 17C is an enlarged view of the electronic component.

FIG. 17B is a top view of a semiconductor wafer 7100 before the dicing step. FIG. 17C is a partial enlarged view of FIG. 17B. A plurality of circuit regions 7102 are provided over the semiconductor wafer 7100. The semiconductor device of one embodiment of the present invention is provided in the circuit region 7102.

Figure 17D:
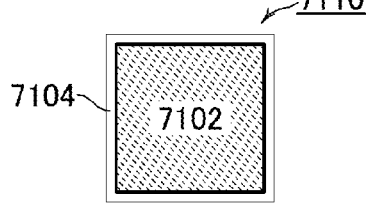
FIG. 17D is an enlarged view of the electronic component.

The plurality of circuit regions 7102 are each surrounded by a separation region 7104. Separation lines (also referred to as dicing lines) 7106 are set at a position overlapping with the separation regions 7104. The semiconductor wafer 7100 is cut along the separation lines 7106 into chips 7110 including the circuit regions 7102 in the dicing step (step ST72). FIG. 17D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 7104 allows a reduction in the usage of pure water. Therefore, the cost of manufacturing semiconductor devices can be reduced. In addition, semiconductor devices can be manufactured with improved productivity.

After Step ST72, the divided chips are separately picked up to be mounted on and bonded to a lead frame in a die bonding step (step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (step ST74). A silver line or a gold line can be used as the metal fine line. Either ball bonding or wedge bonding may be used as wire bonding.

A wire-bonded chip is subjected to a molding step of sealing the chip with an epoxy resin or the like (Step ST75). With the molding step, the inside of the electronic component is filled with a resin, thereby reducing damage to the circuit portion and the wire embedded in the component caused by external mechanical force as well as reducing deterioration of characteristics due to moisture or dust. The lead of the lead frame is plated. After that, a processing step of cutting and processing the lead is performed (Step ST76). Through the plating process, corrosion of the lead can be prevented, and soldering for mounting the electronic component on a printed circuit board in a later step can be performed with higher reliability. Next, printing process (marking) is performed on a surface of the package (Step ST77). After a testing step (Step ST78), the electronic component is completed (Step ST79). An electronic component including the semiconductor device described in the above can achieve low power consumption and a small size.

Figure 17E:
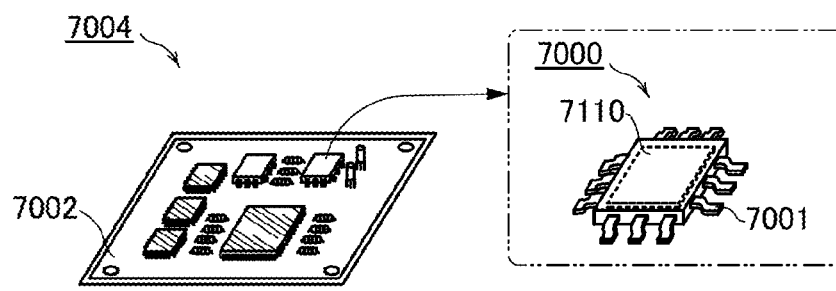
FIG. 17E is a schematic perspective view of the completed electronic component.

FIG. 17E is a schematic perspective view of the completed electronic component. FIG. 17E illustrates a schematic perspective view of a quad flat package (QFP) as an example of the electronic component. As illustrated in FIG. 17E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

The electronic component 7000 can be used as an electronic component (IC chip) of electronic devices in a wide variety of fields, such as digital signal processing, software-defined radio systems, avionics systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Examples of such an electronic device include cameras (e.g., video cameras and digital still cameras), display devices, personal computers (PCs), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multifunction printers, automated teller machines (ATMs), vending machines, and consumer electronics.

Then, applications of the electronic component to an electronic device such as a computer, a portable information terminal (including a cellular phone, a portable game machine, an audio reproducing device, and the like), electronic paper, a television device (also referred to as a television or a television receiver), or a digital video camera are described.

Figure 18A:
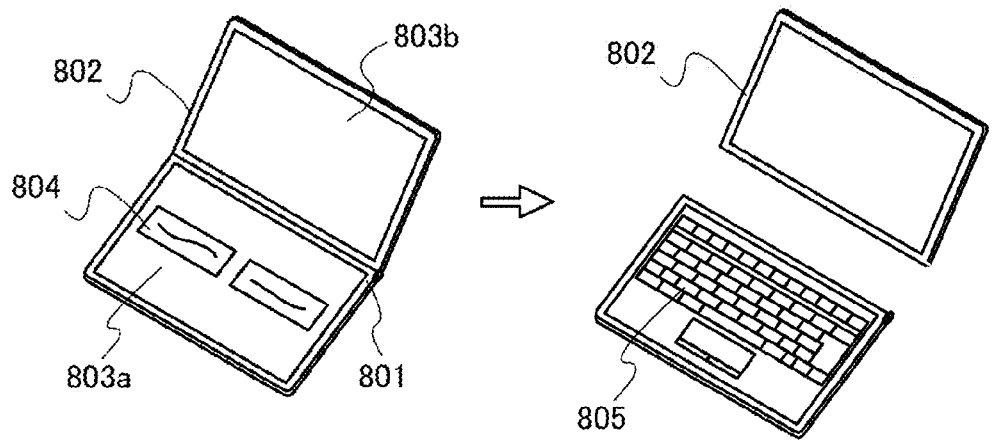
FIGS. 18A to 18E illustrate electronic devices.

FIG. 18A illustrates a portable information terminal, which includes a housing 801, a housing 802, a first display portion 803a, a second display portion 803b, and the like. An electronic component including the above-described semiconductor device is provided in at least one of the housings 801 and 802. Thus, the portable information terminal can switch operations at high speed.

Note that the first display portion 803a is a touch panel, and for example, as illustrated in the left of FIG. 18A, which of "touch input" and "keyboard input" is performed can be selected by a selection button 804 displayed on the first display portion 803a. Since the selection buttons with a variety of sizes can be displayed, the portable information terminal can be easily used by people of any generation. In the case where "keyboard input" is selected, for example, a keyboard 805 is displayed on the first display portion 803a as illustrated in the right of FIG. 18A. With the keyboard 805, letters can be input quickly by keyboard input as in the case of using a conventional information terminal, for example.

Furthermore, one of the first display portion 803a and the second display portion 803b can be detached from the portable information terminal as illustrated in the right of FIG. 18A. The second display portion 803b can also function as a touch panel for a reduction in weight to carry around to be operated by one hand while the other hand supports the housing 802, which is convenient.

The portable information terminal in FIG. 18A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 18A may transmit and receive data wirelessly. Through wireless communication, desired book data or the like can be purchased and downloaded from an electronic book server.

Furthermore, the housing 802 in FIG. 18A may have an antenna, a microphone function, or a wireless communication function to be used as a cellular phone.

Figure 18B:
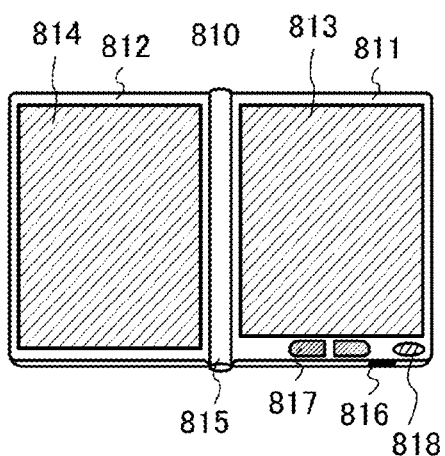

FIG. 18B illustrates an e-book reader 810 including electronic paper. The e-book reader 810 includes two housings 811 and 812. The housing 811 and the housing 812 include a display portion 813 and a display portion 814, respectively. The housings 811 and 812 are connected to each other by a hinge 815, so that the e-book reader 810 can be opened and closed using the hinge 815 as an axis. The housing 811 includes a power button 816, operation keys 817, a speaker 818, and the like. An electronic component including the above-described semiconductor device is provided in at least one of the housings 811 and 812. Thus, the e-book reader can switch operations at high speed.

Figure 18C:
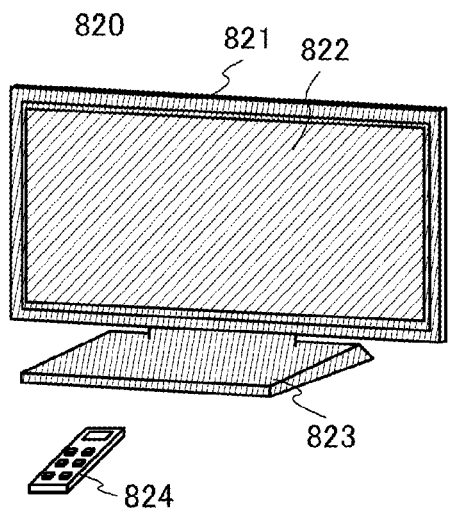

FIG. 18C is a television device 820, which includes a housing 821, a display portion 822, a stand 823, and the like. The television device 820 can operate with a switch of the housing 821 and a remote controller 824. An electronic component including the above-described semiconductor device is provided for each of the housing 821 and the remote controller 824. Thus, the television device can switch operations at high speed.

Figure 18D:
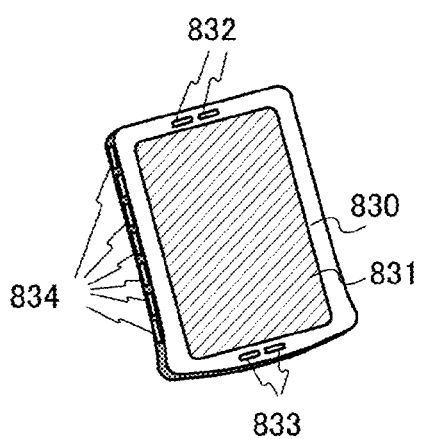

FIG. 18D illustrates a smartphone in which a main body 830 includes a display portion 831, a speaker 832, a microphone 833, operation buttons 834, and the like. An electronic component including the above-described semiconductor device is provided in the main body 830. Thus, the smartphone can switch operations at high speed.

Figure 18E:
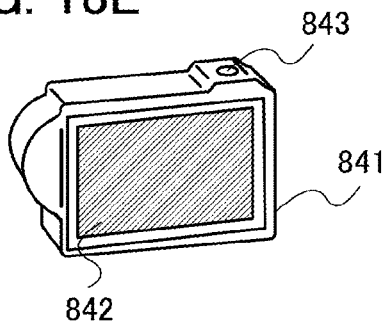

FIG. 18E illustrates a digital camera, which includes a main body 841, a display portion 842, an operation switch 843, and the like. An electronic component including the above-described semiconductor device is provided in the main body 841. Thus, the digital camera can switch operations at high speed.

Example 1

An SRAM-based FPGA in which SRAMs are used for a configuration memory and a register has a difficulty in adopting intermittent operation and normally-off (NOFF) computing which is effective in low-power operation. A nonvolatile FPGA in which nonvolatile memories are used for a configuration memory and a register is proposed.

For example, Non-Patent Document 2 discloses an MRAM-based FPGA, and Non-Patent Document 3 discloses an FeRAM-based FPGA.

As described above, a memory formed using an OS transistor with an extremely small off-state current (hereinafter such a memory is referred to as an OS memory) is a nonvolatile memory owing to the extremely small off-state current of the OS transistor. Non-Patent Document 4 discloses NOFF computing with an OS memory-based FPGA (OS FPGA).

<Fabricated OS FPGA>

In this example, an OS FPGA is fabricated using a Si-OS hybrid process, and evaluation results of the OS FPGA are reported. The fabricated OS FPGA is referred to as OS FPGA 110. In this example, an OS FPGA fabricated in Non-Patent Document 4 is used as a comparative example. The comparative OS FPGA is referred to as OS FPGA 4pv.

Table 1 shows the specifications of the OS FPGA 110. The OS FPGA 110 basically has the same structure as that of the OS FPGA 4pv that enables context switch owing to a multi-context architecture, fine-grained power gating (FG-PG), and NOFF computing, and includes more PLEs than the OS FPGA 4pv.

TABLE 1

Specifications of OS FPGA 110

| CMOS technology | 65 nm, 1-poly 2-metal |
| OS technology | 60 nm |
| Die size | 4.00 mm × 6.68 mm |
| Core size | 1.8 mm × 3.0 mm |
| Number of PLEs | 1 k |

TABLE 1-continued

Specifications of OS FPGA 110

| | |
|---|---|
| Number of PRS's | 224 k |
| Number of CMs | 323.3 kb |
| Number of contexts | 2 |

Figure 19:
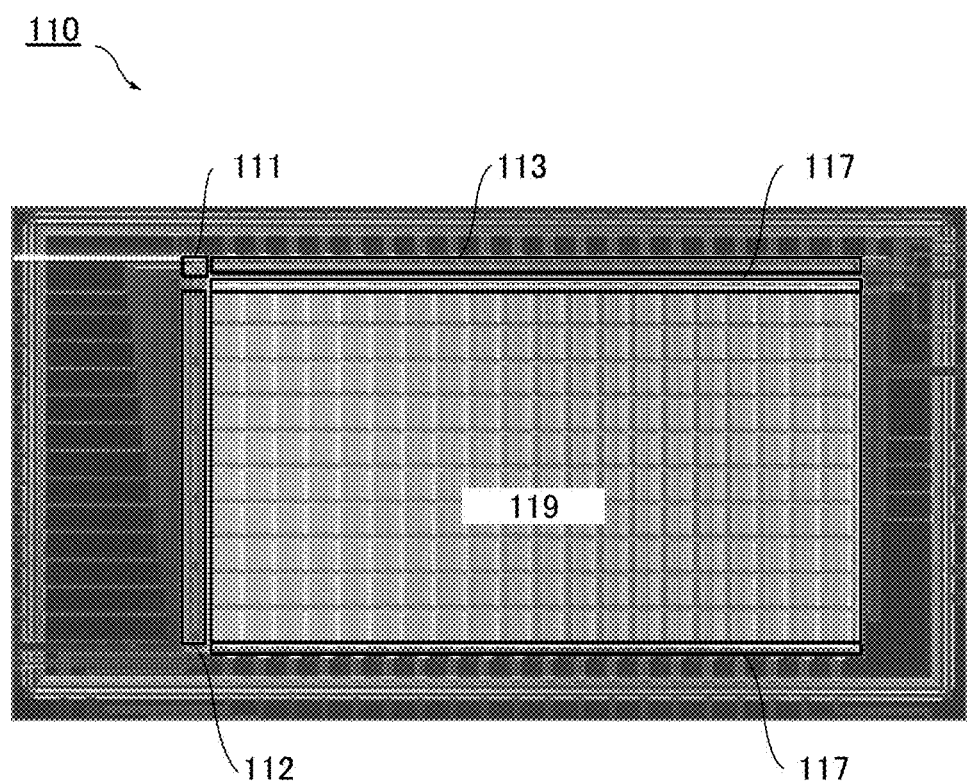
FIG. 19 is a micrograph of a fabricated OS FPGA chip.
Figure 20A:
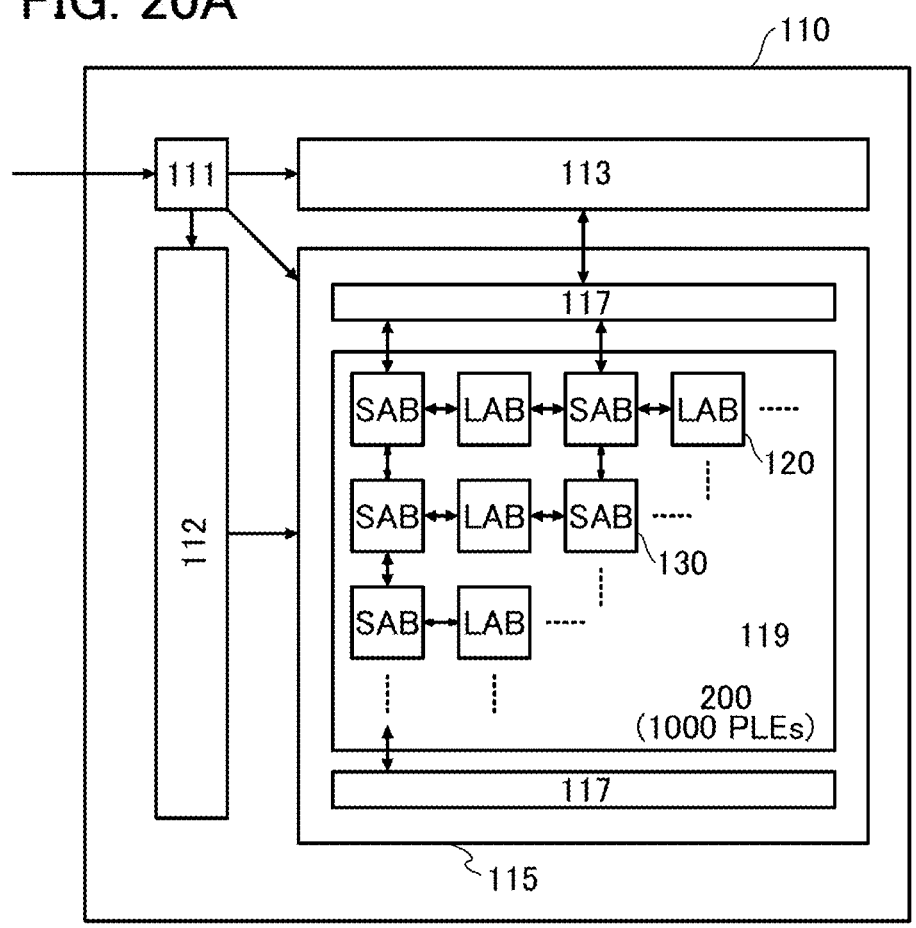
FIG. 20A is a block diagram of a fabricated OS FPGA.

FIG. 19 is a micrograph of a chip of the OS FPGA 110. FIG. 20A is a block diagram of the OS FPGA 110. The OS FPGA 110 includes a controller 111, a word driver 112, a data driver 113, and a programmable area 115.

Figure 20B:
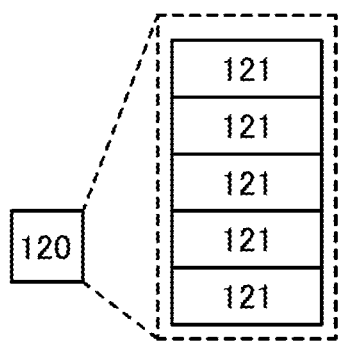
FIG. 20B is a block diagram of a logic array block (LAB)
Figure 20C:
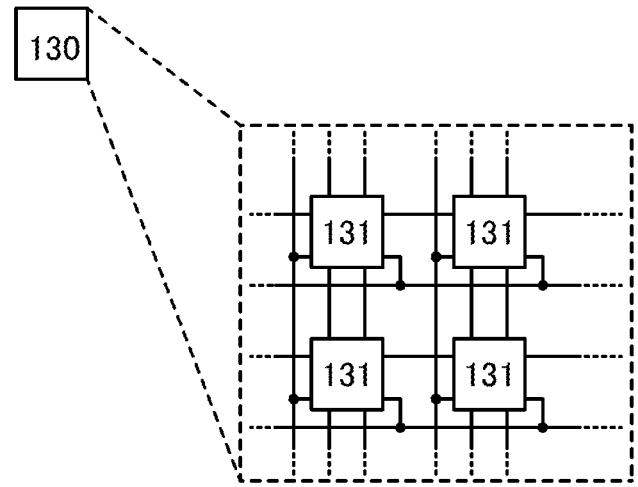
FIG. 20C is a block diagram of a switch array block (SAB).

The programmable area 115 includes two input-output blocks (IOBs) 117 and a core 119. Each of the IOBs 117 includes 20 programmable input-output circuits (PIOs). The core 119 includes 200 logic array blocks (LABs) 120 and a plurality of switch array blocks (SABs) 130. As illustrated in FIG. 20B, each LAB 120 includes five PLEs 121. As illustrated in FIG. 20C, each SAB 130 includes a plurality of switch blocks (SBs) 131 arranged in an array. One LAB 120 is connected to LABs 120 provided on four (left, right, top, and bottom) sides through its input terminals and the SABs 130.

(SB)

Figure 21A:
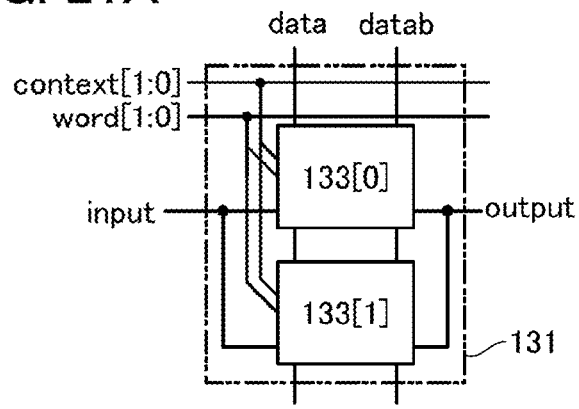
FIG. 21A is a block diagram of a switch block (SB)

The SB 131 is described with reference to FIGS. 21A to 21C. To the SB 131, data, datab, the signal context[1:0], and a signal word[1:01] are input. Note that data and datab are configuration data, and the logic of data and the logic of datab are complementary to each other. The signal context [1:0] is the context selection signal, and the signal word[1:0] is a word line selection signal.

The SB 131 includes a PRS 133[0] and a PRS 133[1]. The PRS 133[0] and the PRS 133[1] include configuration memories (CMs) that can store complementary data.

(PRS)

Figure 21B:
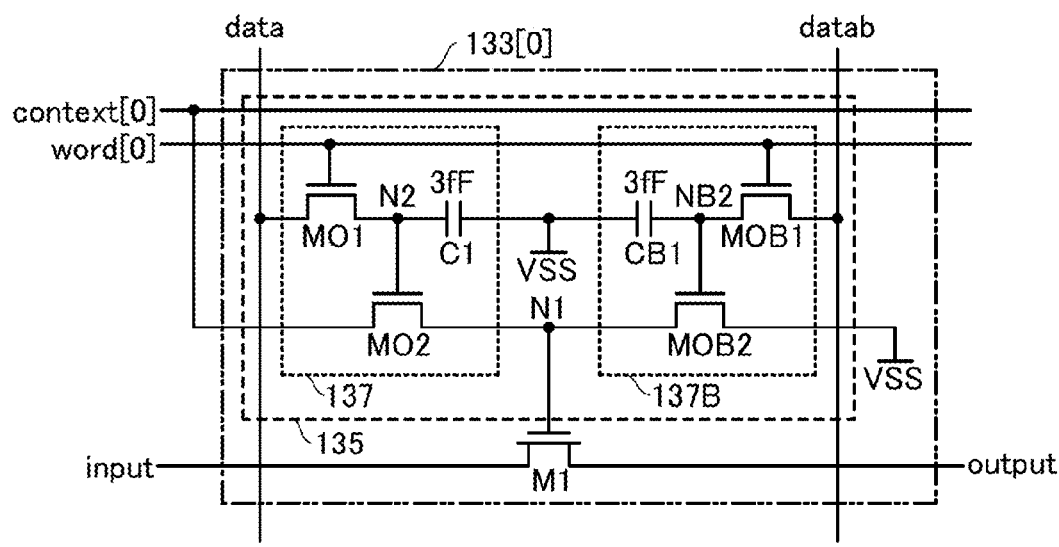
FIG. 21B is a circuit diagram of a programmable routing switch (PRS)
Figure 21C:
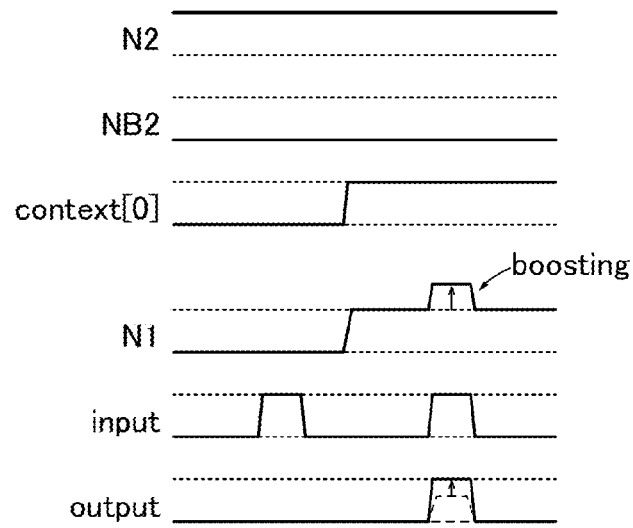
FIG. 21C is a timing chart for the PRS.

FIG. 21B is a circuit diagram of the PRS 133[0]. The PRS 133[0] and the PRS 133[1] have the same circuit structure. Different context selection signals and different word line selection signals are input to the PRS 133[0] and the PRS 133[1]. The signals context[0] and word[0] are input to the PRS 133[0], and the signals context[1] and word[1] are input to the PRS 133[1]. For example, in the SB 131, when the signal context[0] is set at a high level, the PRS 133[0] is activated.

The PRS 133[0] includes a CM 135 and a Si transistor M1. The Si transistor M1 is a pass transistor that is controlled by the CM 135. The CM 135 includes a nonvolatile memories (NVMs) 137 and 137B. The NVMs 137 and 137B have the same circuit structure. The NVM 137 includes a capacitor C1 with 3 fF and OS transistors MO1 and MO2. The NVM 137B includes a capacitor CB1 with 3 fF and OS transistors MOB1 and MOB2.

A gate of the Si transistor M1 is a node N1, a gate of the OS transistor MO2 is a node N2, and a gate of the OS transistor MOB2 is a node NB2. The nodes N2 and NB2 are charge retention nodes of the CM 135. The OS transistor MO2 controls an electrical connection between the node N1 and a signal line for the signal context[0]. The OS transistor MOB2 controls an electrical connection between the node N1 and the low potential power supply line VSS.

Data retained in the NVM 137 and data retained in the NVM 137B are complementary to each other. That is, the CM 135 retains configuration data in a differential manner, so that either the OS transistor MO2 or the OS transistor MOB2 is turned on.

Note that the PRS 133[0] and the PRS 133[1] are referred to as PRS 133 in the case of not being distinguished. The same can be said for the other components.

Figure 22A:
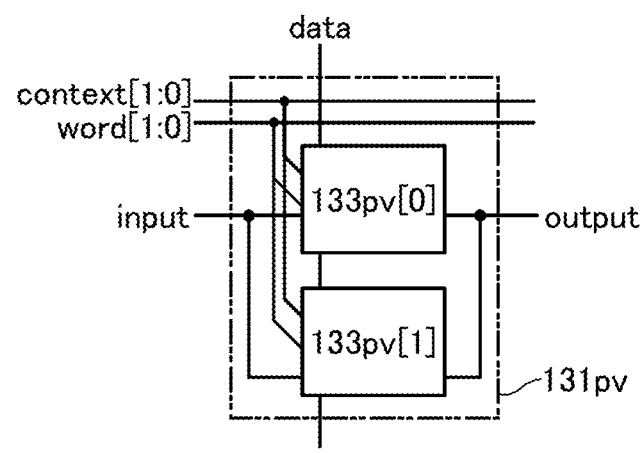
FIG. 22A is a block diagram of a comparative SB.
Figure 22B:
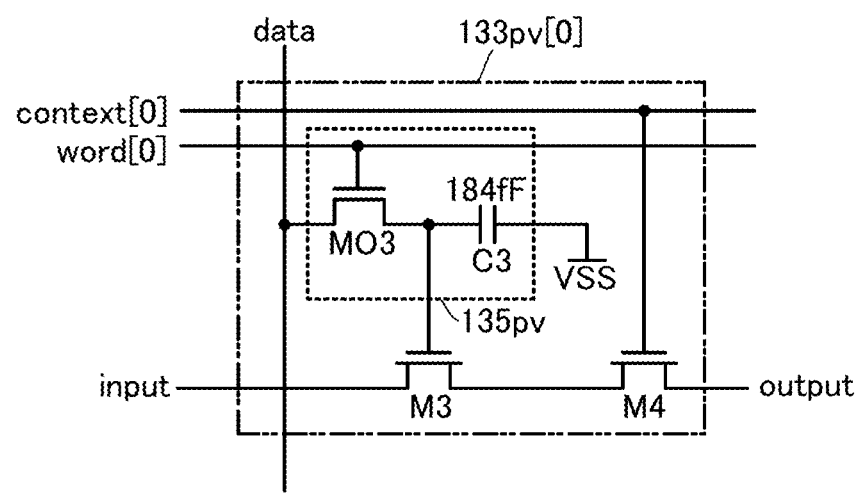
FIG. 22B is a circuit diagram of a comparative PRS.

For comparison, a switch block in the OS FPGA 4pv (hereinafter referred to as SB 131pv) is described. FIG. 22A is a block diagram of the SB 131pv. To the SB 131pv, data, the signal context[1:0], and the signal word[1:0] are input. The SB 131pv includes a PRS 133pv[0] and a PRS 133pv[1]. The PRS 133pv[0] and the PRS 133pv[1] have the same circuit structure. FIG. 22B is a circuit diagram of the PRS 133pv[0].

The signal context[0], the signal word[0], and data are input to the PRS 133pv[0]. The PRS 133pv[0] includes Si transistors M3 and M4 and a CM 135pv. The CM 135pv includes a capacitor C3 and an OS transistor MO3. The CM 135pv is a nonvolatile memory, in which charge is retained in a gate of the Si transistor M3 and charge is retained by the OS transistor MO3 with an extremely small leakage current.

The PRS 133pv improves the switching characteristics by boosting utilizing a floating state of the gate of the Si transistor M3. However, in this example, since the hybrid process based on the 65-nm Si process is employed, gate leakage of the Si transistor is not negligible. Thus, instead of employing a structure in which charge is retained in a gate of a Si transistor, a gate of an OS transistor in which the short channel effect is less likely to occur even with a thick gate insulating film is used as a charge retention node, achieving a nonvolatile OS memory.

The switching operation of the PRS 133[0] is described with reference to FIG. 21C. Configuration data has already been written to the PRS 133[0]. In the PRS 133[0], the node N2 is at H, and the node NB2 is at L.

The PRS 133[0] is inactive while the signal context[0] is at L. During this period, even when the potential of an input terminal of the PRS 133[0] is changed to H, the potential of the gate of the Si transistor M1 is kept at L and the potential of an output terminal of the PRS 133[0] is also kept at L.

The PRS 133[0] is active while the signal context[0] is at H. When the signal context[0] is changed to H, the potential of the gate of the Si transistor M1 is changed to H owing to the configuration data stored in the CM 135.

While the PRS 133[0] is active, when the potential of the input terminal is changed to H, the gate voltage of the Si transistor M1 is increased by boosting because the OS transistor MO2 of the NVM 137 is a source follower. As a result, the OS transistor MO2 of the NVM 137 loses the driving capability, and the gate of the Si transistor M1 is brought into a floating state. That is, like the structure of the PRS 133pv, the structure of the PRS 133 employed in this example also enables the switching characteristics to be improved.

In the PRS 133 with a multi-context function, the CM 135 also functions as a multiplexer. In the PRS 133pv, the pass transistor (Si transistor M4) functions as a multiplexer. Although including a larger number of elements than the PRS 133pv, the PRS 133 does not need a pass transistor, which decreases its switching characteristics, whereby the PRS 133 has an advantage in terms of the switching characteristics.

(PLE)

Figure 23:
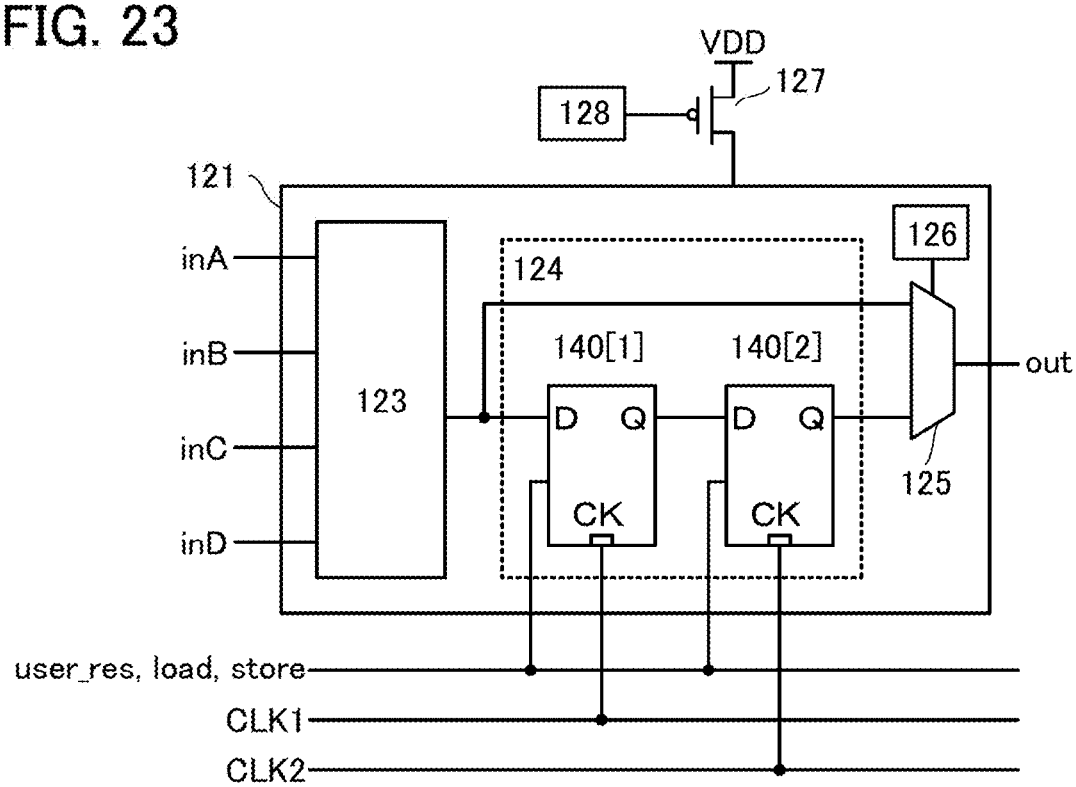
FIG. 23 is a block diagram of a programmable logic element (PLE).

FIG. 23 is a block diagram of the PLE 121. The PLE 121 includes an LUT block 123, a register block 124, a selector 125, and a CM 126. The LUT block 123 is configured to multiplex an output of a pair of 16-bit CMs therein in accordance with inputs inA to inD. The selector 125 is configured to select an output of the LUT block 123 or an output of the register block 124 in accordance with configuration data stored in the CM 126.

The PLE 121 is connected to the high potential power supply line VDD through a power switch 127. The power switch 127 is turned on or off in accordance with configuration data stored in a CM 128. The power switch 127 provided in each PLE 121 allows FG-PG. The PLE 121 which is not used after context switch can be power gated owing to the FG-PG function; thus, standby power can be reduced.

The register block 124 is formed using nonvolatile registers (NV-Regs) to achieve NOFF computing. The NV-Regs in the PLE 121 are flip-flops provided with nonvolatile OS memories (OS-FFs).
(OS-FF)

Figure 24A:
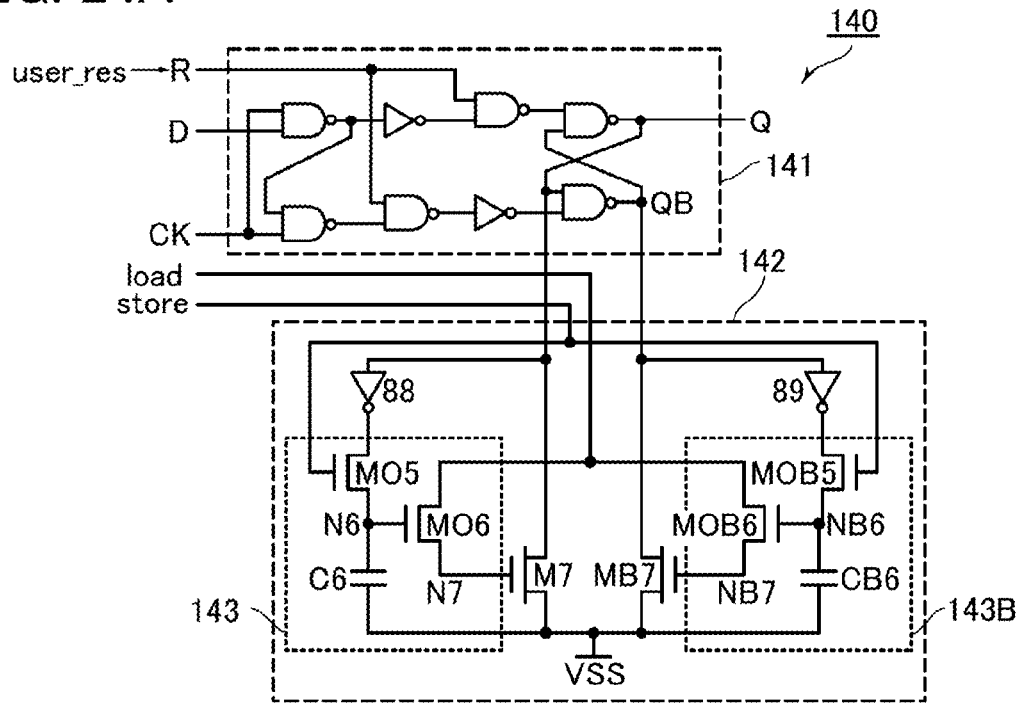
FIG. 24A is a circuit diagram of an OS-FF.

The register block 124 includes an OS-FF 140[1] and an OS-FF 140[2]. A signal user_res, the signal load, and the signal store are input to the OS-FF 140[1] and the OS-FF 140[2]. A clock signal CLK1 is input to the OS-FF 140[1] and a clock signal CLK2 is input to the OS-FF 140[2]. FIG. 24A is a circuit diagram of the OS-FF 140.

The OS-FF 140 includes an FF 141 and a shadow register 142. The FF 141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 142 functions as a backup circuit of the FF 141. The shadow register 142 backs up data of the node Q and data of the node QB in response to the signal store and writes back the backed-up data to the node Q and the node QB in response to the signal load.

The shadow register 142 includes an inverter circuit 88, an inverter circuit 89, a Si transistor M7, a Si transistor MB7, an NVM 143, and an NVM 143B. The NVM 143 and the NVM 143B each have the same circuit structure as the NVM 137 of the PRS 133. The NVM 143 includes a capacitor C6, an OS transistor MO5, and an OS transistor MO6. The NVM 143B includes a capacitor CB6, an OS transistor MOB5, and an OS transistor MOB6. A node N6 and a node NB6 correspond to a gate of the OS transistor MO6 and a gate of the OS transistor MOB6, respectively, and are each a charge retention node. A node N7 and a node NB7 correspond to a gate of the Si transistor M7 and a gate of the Si transistor MB7, respectively.

Figure 24B:
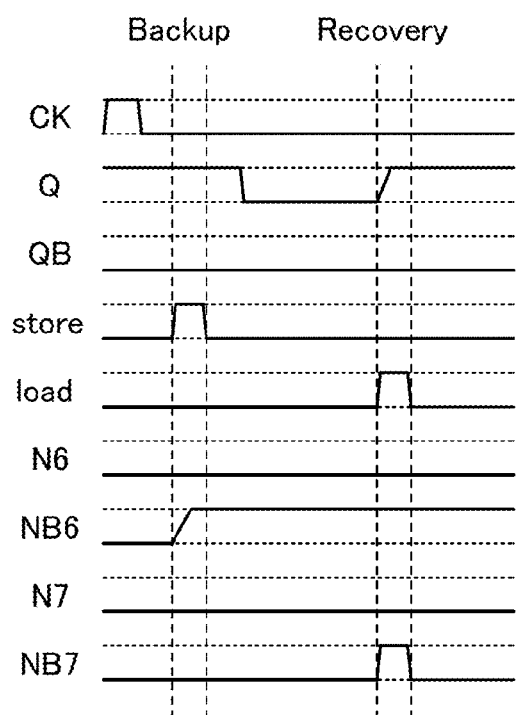
FIG. 24B is a timing chart for the OS-FF.

An operation method of the OS-FF 140 is described with reference to FIG. 24B.
(Backup)

When the signal store at H is input to the OS-FF 140, the shadow register 142 backs up data of the FF 141. The potential of the node N6 is set at L when the data of the node Q is written thereto, and the potential of the node NB6 is set at H when the data of the node QB is written thereto. After that, power gating is performed and the power switch 127 is turned off. Although the data of the node Q and the data of the node QB of the FF 141 are lost, the shadow register 142 retains the backed-up data even when power supply is stopped.
(Recovery)

The power switch 127 is turned on to supply power to the PLE 121. After that, when the signal load at H is input to the OS-FF 140, the shadow register 142 writes back the backed-up data to the FF 141. The potential of the node N7 is kept at L because the potential of the node N6 is at L, and the potential of the node NB7 is set at H because the potential of the node NB6 is at H. Thus, the potential of the node Q is set at H and the node QB is kept at L. That is, the OS-FF 140 is restored to a state at the backup operation.

According to the results of the SPICE simulation, the OS-FF 140 takes 5 ns for backup and 5 ns for recovery. A combination of the FG-PG function and backup/recovery operation of the OS-FF 140 enables low-power driving of the OS FPGA 110.
<Evaluation Results>

The evaluation results of the OS FPGA 110 are described.

Figure 25A:
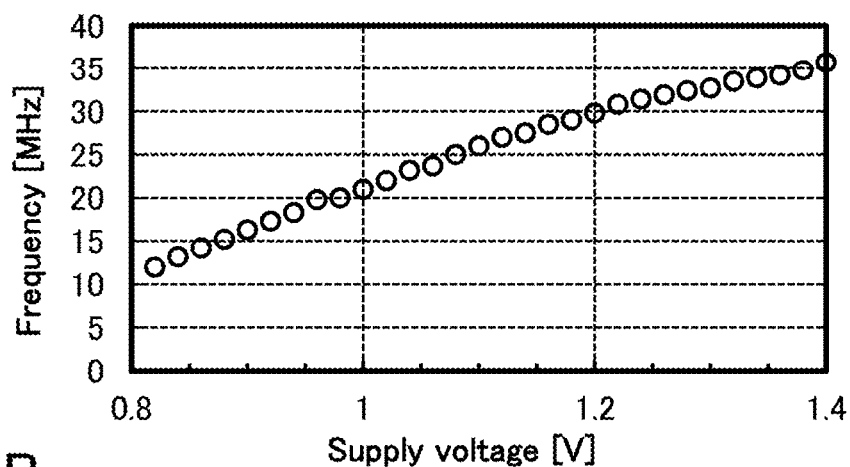
FIG. 25A shows a relation between operation voltage and oscillation frequency of a 7-stage ring-oscillator OS FPGA.

To confirm improvement in operation speed by boosting effects, operation voltage dependence of the oscillation frequency of the OS FPGA 110 with a 7-stage ring oscillator (RO) structure was measured. Measurement results are shown in FIG. 25A.

Figure 25B:
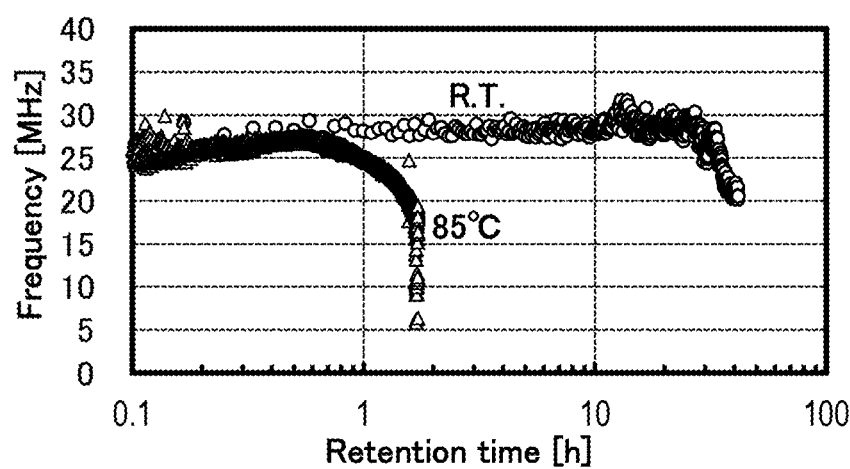
FIG. 25B shows a relation between retention time and oscillation frequency thereof.

FIG. 25B shows the results of the retention test of the OS FPGA 110 with the same circuit structure. The retention times are 40 hours at room temperature (R.T.) and 1.5 hours at 85° C. with an oscillation frequency reduction of approximately 25%. The 7-stage RO structure is kept at the point when the oscillation frequency is reduced by approximately 25%, which indicates that the CMs in the OS FPGA 110 output correct logic.

Figure 25C:
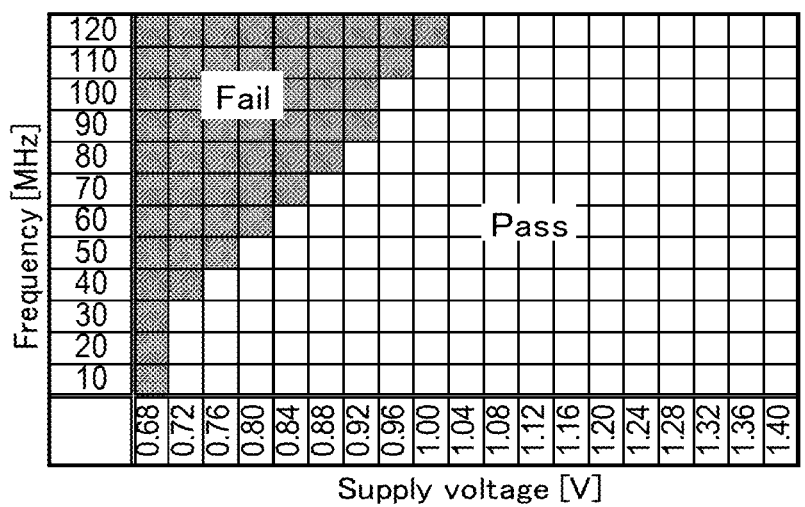
FIG. 25C is a shmoo plot of a 20-stage shift register OS FPGA.

FIG. 25C is a shmoo plot of the OS FPGA 110 with a 20-stage shift register structure.

Figure 26A:
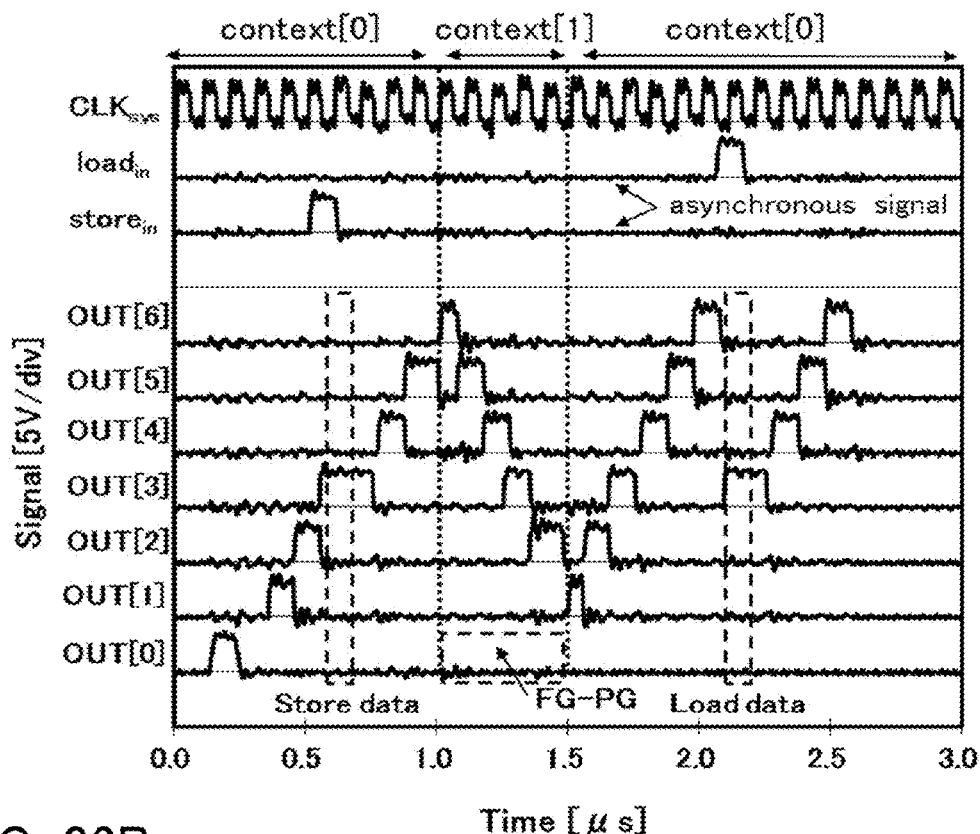
FIG. 26A shows output waveforms of an OS FPGA.

The multi-context function and the NOFF function of the OS FPGA 110 were examined. FIG. 26A shows output signal waveforms of the OS FPGA 110 in the examination. The operation frequency (the frequency of a clock signal $CLK_{sys}$) was 10 MHz, and the operation voltage was 1.2 V. As for the circuit structure of the OS FPGA 110 used in the example of FIG. 26A, a 7-stage shift register was used in the case of using the signal context[0], and a 7-stage reverse shift register was used in the case of using the signal context[1].

It is demonstrated by the signal waveforms that the circuit structure of the OS FPGA 110 was changed from the 7-stage shift register to the 7-stage reverse shift register within one clock after context switch, that the backup/recovery operation of the OS FPGA 110 with the 7-stage shift register structure was performed, and that retention and reading of data were normally executed.

Figure 26B:
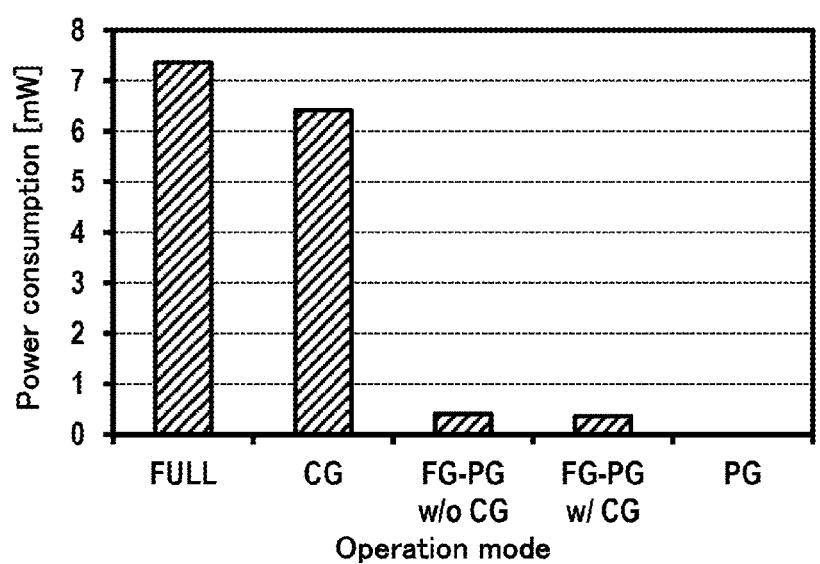
FIG. 26B shows power consumptions in different operation modes of a 20-stage shift register OS FPGA.

Power consumption in each operation mode of the OS FPGA 110 with the 20-stage shift register structure was measured. Measurement results are shown in FIG. 26B. The power consumption of the core 119 of the OS FPGA 110 was reduced by 12.8% in a CG mode, by 94.5% in an FG-PG mode, and by 95.1% in a combination mode of FG-PG and CG. The reduction percentages were calculated on the basis of the power consumption in a full mode.

This example demonstrates that the OS FPGA 110 can perform 1-clock context switch by a multi-context function and have an NOFF function required for low-power operation.

Table 2 shows comparison between the specifications of the OS FPGA 110 and those of the OS FPGA 4pv.

TABLE 2

| Specifications | OS FPGA 110 (Example 1) | OS FPGA 4pv (Comparative example) |
| --- | --- | --- |
| CMOS technology | 65 nm, 1-poly 2-metal | 0.5 µm-SOI |
| OS technology | 60 nm | 1.0 µm |
| Die size | 4.00 mm × 6.68 mm | 4.52 mm × 5.52 mm |
| Number of PLEs | 1 k | 20 |
| Number of Si transistors | 3.0 M | 3.9 k |

TABLE 2-continued

| Specifications | | OS FPGA 110 (Example 1) | OS FPGA 4pv (Comparative example) |
|---|---|---|---|
| Number of OS transistors | | 1.4 M | 15 k |
| PRS | | Pass transistor + OS transistor | Pass transistor + OS transistor |
| Power supply voltage | | 1.2 V | 2.5 V |
| Performance | Circuit | 20-stage shift register | 5-stage shift register |
| | Highest oscillation frequency | 120 MHz | 10 MHz |
| | Power | 0.41 mW at 100 MHz (core) | 4.13 mW at 10 MHz |
| Nonvolatile | | ✓ (OS transistor + capacitor) | ✓ (OS transistor + capacitor) |
| Context switch | | ✓ | ✓ |
| Boosting | | ✓ | ✓ |
| NOFF | | ✓ | ✓ |

<Notes on Description of this Specification and the Like>

In this specification and the like, ordinal numbers such as first, second, and third are used in order to avoid confusion among components. Thus, the terms do not limit the number or order of components.

In a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

The same elements or elements having similar functions, elements formed using the same material, elements formed at the same time, or the like in the drawings are denoted by the same reference numerals, and the description thereof is not repeated in some cases.

In this specification and the like, the terms "one of a source and a drain" (or first electrode or first terminal) and "the other of the source and the drain" (or second electrode or second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

This application is based on Japanese Patent Application Serial No. 2016-101128 filed with Japan Patent Office on May 20, 2016, and Japanese Patent Application Serial No. 2016-208279 filed with Japan Patent Office on Oct. 25, 2016, the entire contents of which are hereby incorporated by reference.

What is claimed is:

1. A semiconductor device comprising:
a first charge retention circuit;
a second charge retention circuit;
a first switch;
a second switch; and
a buffer circuit,
wherein the first charge retention circuit and the second charge retention circuit each comprise a first transistor and a second transistor,
wherein the first transistor and the second transistor each comprise an oxide semiconductor in a semiconductor layer serving as a channel formation region,
wherein one of a source and a drain of the first transistor is electrically connected to a gate of the second transistor,
wherein one of a source and a drain of the second transistor is electrically connected to one terminal of the first switch or one terminal of the second switch,
wherein the other terminal of the first switch is electrically connected to the other terminal of the second switch and an input terminal of the buffer circuit,
wherein electrostatic capacitance of the one terminal of the first switch is larger than electrostatic capacitance of the input terminal of the buffer circuit, and
wherein electrostatic capacitance of the one terminal of the second switch is larger than the electrostatic capacitance of the input terminal of the buffer circuit.

2. The semiconductor device according to claim 1, wherein turning on or off of each of the first switch and the second switch is controlled by a context switch signal.

3. The semiconductor device according to claim 1, wherein the first switch and the second switch each comprise a third transistor, and
wherein the third transistor comprises silicon in a semiconductor layer serving as a channel formation region.

4. The semiconductor device according to claim 3, wherein the first transistor and the second transistor are provided over the third transistor.

5. The semiconductor device according to claim 4, further comprising:
a first capacitor having a terminal electrically connected to the one terminal of the first switch; and
a second capacitor having a terminal electrically connected to the one terminal of the second switch, and
wherein the first capacitor and the second capacitor are provided over the first transistor and the second transistor.

6. An electronic component comprising:
the semiconductor device according to claim 1; and
a lead electrically connected to the semiconductor device.

7. An electronic device comprising:
the electronic component according to claim 6; and
at least one of a display device, a touch panel, a microphone, a speaker, an operation key, and a housing.

8. A semiconductor device comprising:
a first circuit comprising a first transistor and a second transistor;
a second circuit comprising a third transistor and a fourth transistor;
a first switch;
a second switch; and
a third circuit,
wherein the first transistor, the second transistor, the third transistor, and the fourth transistor each comprise an oxide semiconductor in a semiconductor layer serving as a channel formation region,
wherein one of a source and a drain of the first transistor is electrically connected to a gate of the second transistor and one of a source and a drain of the third transistor is electrically connected to a gate of the fourth transistor,
wherein one of a source and a drain of the second transistor is electrically connected to one terminal of the first switch and one of a source and a drain of the fourth transistor is electrically connected to one terminal of the second switch, and
wherein the other terminal of the first switch is electrically connected to the other terminal of the second switch and an input terminal of the third circuit.

9. The semiconductor device according to claim 8,
wherein the first switch and the second switch each comprise a fifth transistor, and
wherein the fifth transistor comprises silicon in a semiconductor layer serving as a channel formation region.

10. The semiconductor device according to claim 9,
wherein the first transistor, the second transistor, the third transistor, and the fourth transistor are provided over the fifth transistor.

11. The semiconductor device according to claim 10, further comprising:
a first capacitor having a terminal electrically connected to the one terminal of the first switch; and
a second capacitor having a terminal electrically connected to the one terminal of the second switch, and
wherein the first capacitor and the second capacitor are provided over the first transistor and the second transistor.

12. An electronic component comprising:
the semiconductor device according to claim 8; and
a lead electrically connected to the semiconductor device.

13. An electronic device comprising:
the electronic component according to claim 12; and
at least one of a display device, a touch panel, a microphone, a speaker, an operation key, and a housing.

14. A semiconductor device comprising:
a first charge retention circuit;
a second charge retention circuit;
a first switch;
a second switch; and
a buffer circuit,
wherein the first charge retention circuit and the second charge retention circuit each comprise a first transistor and a second transistor,
wherein one of a source and a drain of the first transistor is electrically connected to a gate of the second transistor,
wherein one of a source and a drain of the second transistor is electrically connected to one terminal of the first switch or one terminal of the second switch,
wherein the other terminal of the first switch is electrically connected to the other terminal of the second switch and an input terminal of the buffer circuit,
wherein electrostatic capacitance of the one terminal of the first switch is larger than electrostatic capacitance of the input terminal of the buffer circuit, and
wherein electrostatic capacitance of the one terminal of the second switch is larger than the electrostatic capacitance of the input terminal of the buffer circuit.

15. The semiconductor device according to claim 14,
wherein turning on or off of each of the first switch and the second switch is controlled by a context switch signal.

16. The semiconductor device according to claim 14,
wherein the first switch and the second switch each comprise a third transistor, and
wherein the third transistor comprises silicon in a semiconductor layer serving as a channel formation region.

17. The semiconductor device according to claim 16,
wherein the first transistor and the second transistor are provided over the third transistor.

18. The semiconductor device according to claim 17, further comprising:
a first capacitor having a terminal electrically connected to the one terminal of the first switch; and
a second capacitor having a terminal electrically connected to the one terminal of the second switch, and
wherein the first capacitor and the second capacitor are provided over the first transistor and the second transistor.

19. An electronic component comprising:
the semiconductor device according to claim 14; and
a lead electrically connected to the semiconductor device.

20. An electronic device comprising:
the electronic component according to claim 19; and
at least one of a display device, a touch panel, a microphone, a speaker, an operation key, and a housing.

21. A semiconductor device comprising:
a first circuit comprising a first transistor and a second transistor;
a second circuit comprising a third transistor and a fourth transistor;
a first switch;
a second switch; and
a third circuit,
wherein one of a source and a drain of the first transistor is electrically connected to a gate of the second transistor and one of a source and a drain of the third transistor is electrically connected to a gate of the fourth transistor,
wherein one of a source and a drain of the second transistor is electrically connected to one terminal of the first switch and one of a source and a drain of the fourth transistor is electrically connected to one terminal of the second switch, and wherein the other terminal of the first switch is electrically connected to the other terminal of the second switch and an input terminal of the third circuit.

22. The semiconductor device according to claim 21, wherein the first switch and the second switch each comprise a fifth transistor, and wherein the fifth transistor comprises silicon in a semiconductor layer serving as a channel formation region.

23. The semiconductor device according to claim 22, wherein the first transistor, the second transistor, the third transistor, and the fourth transistor are provided over the fifth transistor.

24. The semiconductor device according to claim 23, further comprising:

a first capacitor having a terminal electrically connected to the one terminal of the first switch; and a second capacitor having a terminal electrically connected to the one terminal of the second switch, and wherein the first capacitor and the second capacitor are provided over the first transistor and the second transistor.

25. An electronic component comprising:

the semiconductor device according to claim 21; and a lead electrically connected to the semiconductor device.

26. An electronic device comprising:

the electronic component according to claim 25; and at least one of a display device, a touch panel, a microphone, a speaker, an operation key, and a housing.

* * * * *